US012641794B2

(12) United States Patent
Im et al.

(10) Patent No.: US 12,641,794 B2
(45) Date of Patent: May 26, 2026

(54) SEMICONDUCTOR DEVICE INCLUDING FERROELECTRIC LAYER AND METHOD OF MANUFACTURING THE SAME

(71) Applicant: SK hynix Inc., Icheon-si (KR)

(72) Inventors: Mir Im, Icheon-si (KR); Jae Gil Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 489 days.

(21) Appl. No.: 18/298,167

(22) Filed: Apr. 10, 2023

(65) Prior Publication Data

US 2023/0247840 A1      Aug. 3, 2023

Related U.S. Application Data

(63) Continuation-in-part of application No. 17/317,663, filed on May 11, 2021, now Pat. No. 11,792,995.

(30) Foreign Application Priority Data

Dec. 15, 2020      (KR) ......................... 10-2020-0175878

(51) Int. Cl.
*H10B 51/20* (2023.01)
*G11C 11/22* (2006.01)
*H10B 51/10* (2023.01)
*H10B 51/30* (2023.01)

(52) U.S. Cl.
CPC .......... *H10B 51/20* (2023.02); *G11C 11/2255* (2013.01); *H10B 51/10* (2023.02); *H10B 51/30* (2023.02)

(58) Field of Classification Search
CPC ........ H10B 51/10; H10B 51/20; H10B 51/30; H01L 29/40111; H01L 29/516; H01L 29/517; H01L 29/518; H01L 29/78391; G11C 11/2255
See application file for complete search history.

(56) References Cited

U.S. PATENT DOCUMENTS

| | | | | |
|---|---|---|---|---|
| 11,171,157 B1 * | 11/2021 | Lai | ......................... | H10B 51/30 |
| 11,282,559 B1 * | 3/2022 | Tanaka | ................ | G11C 11/2275 |
| 2018/0240804 A1 * | 8/2018 | Yoo | ................... | H01L 21/02189 |
| 2020/0105773 A1 | 4/2020 | Morris et al. | | |
| 2021/0126013 A1 * | 4/2021 | Lai | ..................... | H10D 30/025 |
| 2022/0037362 A1 * | 2/2022 | Lin | .................... | H10D 30/0415 |

FOREIGN PATENT DOCUMENTS

| | | | | | |
|---|---|---|---|---|---|
| CN | 107068686 A | * | 8/2017 | ........ | H01L 27/11556 |
| CN | 110970446 A | | 4/2020 | | |
| EP | 3629329 A1 | * | 4/2020 | .......... | G11C 11/223 |
| KR | 101649091 B1 | | 8/2016 | | |

* cited by examiner

*Primary Examiner* — Matthew E Warren

(57) ABSTRACT

A semiconductor device according to an embodiment includes a substrate, a bit line structure and a source line structure each extending in a direction perpendicular to a surface of the substrate, a semiconductor layer disposed between the bit line structure and the source line structure on a plane parallel to the surface of the substrate, a ferroelectric layer disposed on the semiconductor layer and including a ferroelectric superlattice structure, and a gate electrode layer disposed on the ferroelectric layer.

18 Claims, 40 Drawing Sheets

1551

S1

S2

SEMICONDUCTOR DEVICE INCLUDING FERROELECTRIC LAYER AND METHOD OF MANUFACTURING THE SAME

CROSS-REFERENCE TO RELATED APPLICATIONS

The present application is a continuation in part of pending U.S. patent application Ser. No. 17/317,663, filed on May 11, 2021, which claims priority under 35 U.S.C. 119(a) to Korean Application No. 10-2020-0175878, filed on Dec. 15, 2020, which is herein incorporated by references in its entirety.

BACKGROUND

1. Technical Field

The present disclosure generally relates to a semiconductor device, and more particularly, to a semiconductor device including a ferroelectric layer and a method of manufacturing the same.

2. Related Art

In general, ferroelectric material refers to a material that has spontaneous electrical polarization in a state in which an external electric field is not applied. Further, in the ferroelectric material, when an external electric field is applied, the electrical polarization may exhibit hysteresis behavior. Accordingly, by controlling the applied external electric field, various polarizations may be reversibly implemented in the ferroelectric material following the hysteresis behavior. This feature may be applied to a semiconductor device that stores signal information in a non-volatile manner.

SUMMARY

A semiconductor device according to an embodiment of the present disclosure may include a substrate, a bit line structure and a source line structure each extending in a direction perpendicular to a surface of the substrate, a semiconductor layer disposed between the bit line structure and the source line structure on a plane parallel to the surface of the substrate, a ferroelectric layer disposed on the semiconductor layer and including a ferroelectric superlattice structure, and a gate electrode layer disposed on the ferroelectric layer.

A semiconductor device according to another embodiment of the present disclosure may include a substrate, a bit line structure and a source line structure each extending in a direction perpendicular to a surface of the substrate, and a plurality of unit cell structures electrically connected to the bit line structure and the source line structure. Each of the plurality of unit cell structures may include a semiconductor layer disposed on a plane parallel to the surface of the substrate and in contact with the bit line structure and the source line structure, a ferroelectric layer disposed on the semiconductor layer and including a ferroelectric superlattice structure, and a gate electrode layer disposed to be spaced apart from the bit line structure and the source line structure on the ferroelectric layer. The plurality of unit cell structures may be disposed to be spaced apart from each other in a direction perpendicular to the surface of the substrate.

DETAILED DESCRIPTION

Figure 1:
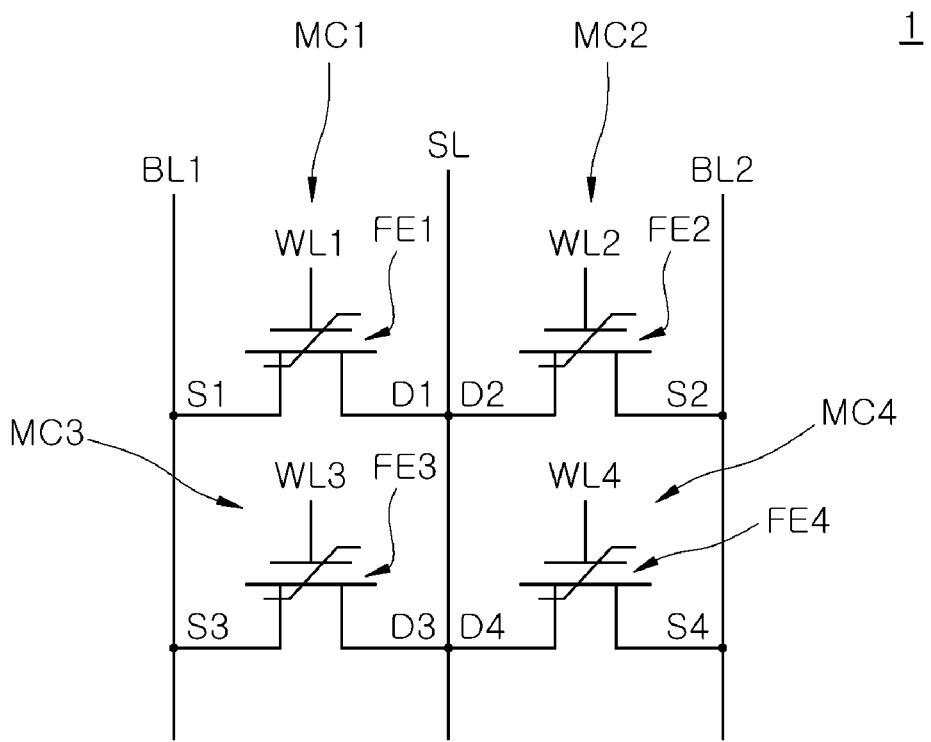
FIG. 1 is a schematic circuit diagram of a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. Overall, the drawings are explained from an observer's point of view, and when an element is referred to as being positioned above another element, this includes all the meanings, including an element that may be positioned directly above another element or an additional element that may be interposed between those elements. The same reference numerals in the plurality of drawings refer to substantially the same elements.

In addition, expression of a singular form of a word should be understood to include the plural forms of the word unless clearly used otherwise in the context. It will be understood that the terms "comprise," "include," or "have" are intended to specify the presence of a feature, a number, a step, an operation, a component, an element, a part, or combinations thereof, but not used to preclude the presence or possibility of adding one or more other features, numbers, steps, operations, components, elements, parts, or combinations thereof. In addition, in performing a method or a manufacturing method, each of the processes constituting the method may occur differently from the specified order unless a specific order is clearly stated in the context. That is, each of the processes may occur in the same order as specified, may be performed substantially simultaneously, or may be performed in a reverse order or a different order.

According to embodiments of the present disclosure, a semiconductor device including a field effect transistor-type unit cell structure including a ferroelectric layer may be provided. The ferroelectric layer may be disposed between a channel region and a gate electrode layer of a field effect transistor. In an embodiment, the semiconductor device may function as a nonvolatile memory device. A write operation of the semiconductor device may be performed by applying a write voltage to the gate electrode layer to write different polarization states in the ferroelectric layer. Different polarization states may be stored in the form of remanent polarization after the write voltage is removed. The stored remanent polarization states may function as signal information. A read operation of the semiconductor device may be performed by reading a threshold voltage of the field effect transistor, which changes according to the size or orientation of the remanent polarization stored in the ferroelectric layer.

FIG. 1 is a schematic circuit diagram of a semiconductor device according to an embodiment of the present disclosure. Referring to FIG. 1, a semiconductor device 1 may include a plurality of unit cells MC1, MC2, MC3, and MC4 disposed between a source line SL and any one of first and second bit lines BL1 and BL2. Although FIG. 1 illustrates the first to fourth unit cells MC1, MC2, MC3, and MC4 as an example of the plurality of unit cells, the plurality of unit cells are not necessarily limited thereto and various numbers of unit cells may be utilized.

Referring to FIG. 1, the first to fourth unit cells MC1, MC2, MC3, and MC4 may be field effect transistor-type memory cells having first to fourth ferroelectric layers FE1, FE2, FE3, and FE4, respectively, as gate dielectric layers. First to fourth word lines WL1, WL2, WL3, and WL4 may be electrically connected to the first to fourth ferroelectric layers FE1, FE2, FE3, and FE4 of the first to fourth unit cells MC1, MC2, MC3, and MC4, respectively.

Source electrodes S1 and S2 of the field effect transistors constituting the first and second unit cells MC1 and MC2 may be electrically connected to the first and second bit lines BL1 and BL2, respectively. Drain electrodes D1 and D2 of the field effect transistors constituting the first and second unit cells MC1 and MC2 may be electrically connected to a common source line SL. That is, the first and second unit cells MC1 and MC2 may share the source line SL.

Source electrodes S3 and S4 of the field effect transistors constituting the third and fourth unit cells MC3 and MC4 may be electrically connected to the first and second bit lines BL1 and BL2, respectively. Drain electrodes D3 and D4 of the field effect transistors constituting the third and fourth unit cells MC3 and MC4 may be electrically connected to the common source line SL. That is, the third and fourth unit cells MC3 and MC4 may share the source line SL.

The circuit configuration of the semiconductor device 1 in FIG. 1 may be applied to semiconductor devices 1a, 1b, and 1c according to embodiments of the present disclosure described below.

Figure 2A:
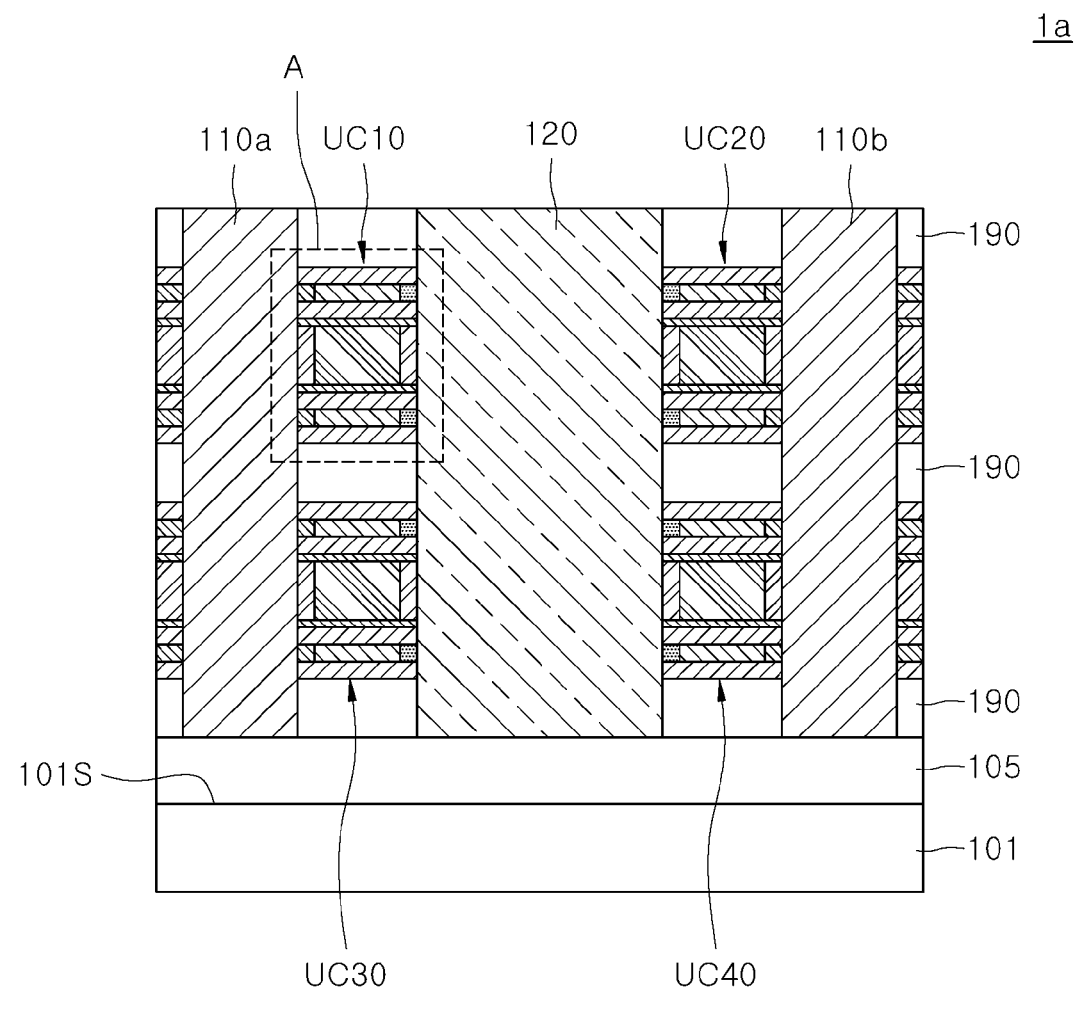
FIG. 2A is a schematic cross-sectional view illustrating a semiconductor device according to an embodiment of the present disclosure.
Figure 2A:
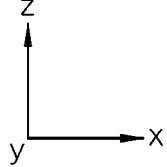
Figure 2B:
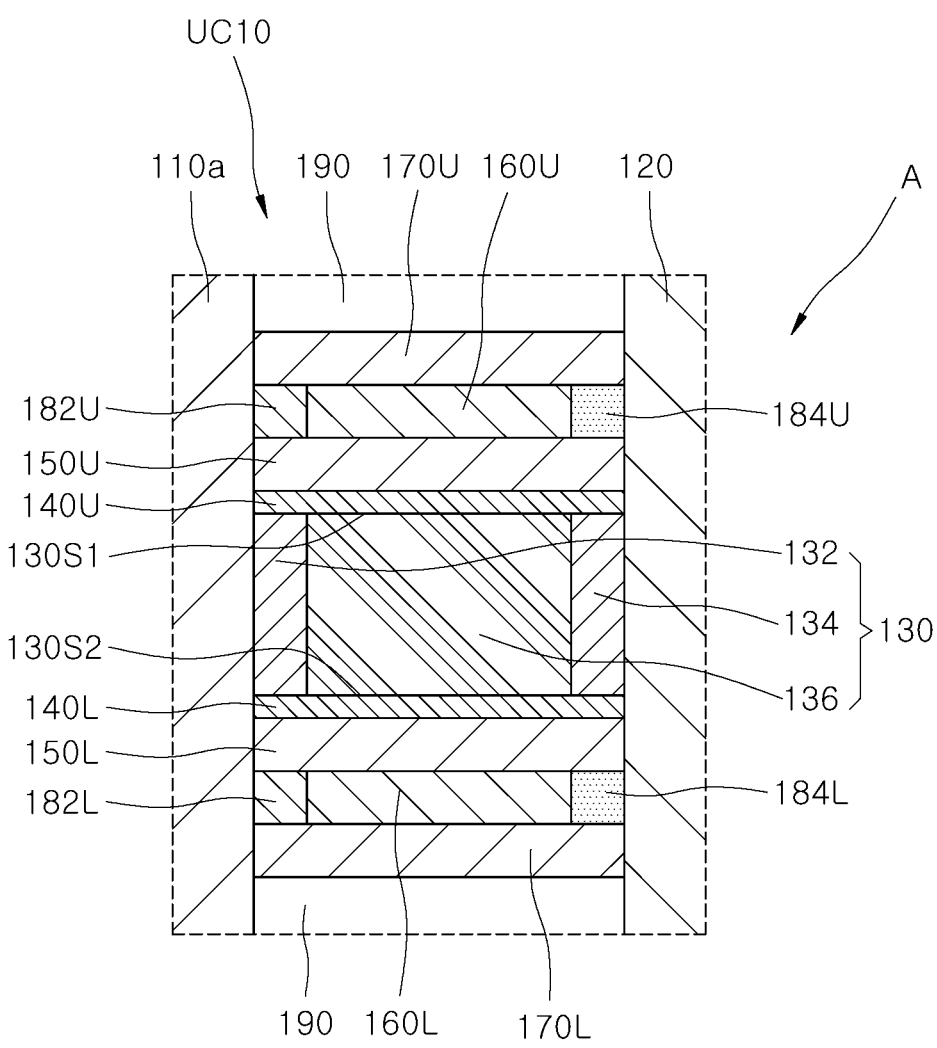
FIG. 2B is an enlarged view of portion "A" of a semiconductor device of FIG. 2A.

FIG. 2A is a schematic cross-sectional view of a semiconductor device according to an embodiment of the present disclosure. FIG. 2B is an enlarged view of portion "A" of a semiconductor device of FIG.

Referring to FIG. 2A, a semiconductor device 1a may include a substrate 101, first and second bit line structures 110a and 110b, a source line structure 120, and first to fourth unit cell structures UC10, UC20, UC30, and UC40. The first and second bit line structures 110a and 110b and the source line structure 120 may extend in a first direction (i.e., z-direction) perpendicular to a surface 101S of the substrate 101.

The first and third unit cell structures UC10 and UC30 may be disposed between the first bit line structure 110a and the source line structure 120. The first and third unit cell structures UC10 and UC30 may be electrically connected to the first bit line structure 110a and the source line structure 120. The first and the third unit cell structures UC10 and UC30 may be disposed to be spaced apart from each other in the first direction (i.e., z-direction). An interlayer insulating layer 190 may be disposed between the first and third unit cell structures UC10 and UC30.

The second and fourth unit cell structures UC20 and UC40 may be disposed between the second bit line structure 110b and the source line structure 120. The second and fourth unit cell structures UC20 and UC40 may be electrically connected to the second bit line structure 110b and the source line structure 120. The second and fourth unit cell structures UC20 and UC40 may be disposed to be spaced apart from each other in the first direction (i.e., z-direction). The interlayer insulating layer 190 may be disposed between the second and fourth unit cell structures UC20 and UC40.

FIG. 2A illustrates four unit cell structures, but the present disclosure is not limited thereto. Various numbers of unit cell structures may be disposed between the first bit line structure 110a and the source line structure 120. Likewise, various numbers of unit cell structures may be disposed between the second bit line structure 110b and the source line structure 120.

Referring to FIG. 2A, the substrate 101 may include a semiconductor material. As an example, the semiconductor material may be made of or include silicon (Si), germanium (Ge), gallium arsenide (GaAs), molybdenum selenide (MoSe2), hafnium selenide (HfSe2), indium selenide (InSe), gallium selenide (GaSe), black phosphorus, indium-gallium-zinc oxide (IGZO), or a combination of two or more thereof. The semiconductor material may be doped with a dopant. As an example, the semiconductor material may be doped with an N-type dopant or a P-type dopant.

An integrated circuit may be disposed on the substrate 101. As an example, the integrated circuit may include a driving circuit or a control circuit for the first to fourth unit cell structures UC10, UC20, UC30, and UC40. The integrated circuit may include at least one field effect transistor.

A base insulating layer 105 may be disposed on the substrate 101. The base insulating layer 105 may electrically insulate the first bit line 110a, the second bit line 110b, and the source line 120 from the substrate 101. The base insulating layer 105 may be made of or include an insulating material. The insulating material may include, for example, oxide, nitride, oxynitride, or a combination of two or more thereof.

The first and second bit line structures 110a and 110b may be disposed to be spaced apart from each other on the base insulating layer 105. Each of the first and second bit line structures 110a and 110b may extend in the first direction (i.e., z-direction). The first and second bit line structures 110a and 110b may correspond to the first and second bit lines BL1 and BL2 in the circuit diagram of FIG. 1.

Each of the first and second bit line structures 110a and 110b may be a pillar-shaped structure. As an example, the first and second bit line structures 110a and 110b may be rectangular pillar-shaped structures. Each of the first and second bit line structures 110a and 110b may be made of or include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. In an embodiment, the first and second bit line structures 110a and 110b may be made of substantially the same material.

The source line structure 120 may be disposed on the base insulating layer 105. The source line structure 120 may be disposed between the first and second bit line structures 110a and 110b. The source line structure 120 may extend in the first direction (i.e., z-direction). The source line structure 120 may correspond to the source line SL in the circuit diagram of FIG. 1.

The source line structure 120 may be a pillar-shaped structure. As an example, the source line structure 120 may be a rectangular pillar-shaped structure. The source line structure 120 may be made of or include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 2A, the first to fourth unit cell structures UC10, UC20, UC30, and UC40 may correspond to the first to fourth unit cells MC1, MC2, MC3, and MC4 in the circuit diagram of FIG. 1. Each of the first to fourth unit cell structures U10, U20, U30, and U40 may have substantially the same configuration. Hereinafter, the first unit cell structure UC10 from among the first to fourth unit cell structures U10, U20, U30, and U40 will be described with reference to FIG. 2B. The configurations of the second to fourth unit cell structures U20, U30, and U40 may be apparent from the configuration of the first unit cell structure UC10.

Referring to FIGS. 2A and 2B, a semiconductor layer 130 may be disposed on a plane parallel to the surface 101S of the substrate 101 common to the base insulating layer 105. As an example, the plane parallel to the surface 101S of the substrate 101 may be a plane perpendicular to the first direction (i.e., z-direction). The semiconductor layer 130 may be disposed between the first bit line structure 110a and the source line structure 120. In an embodiment, side surfaces of the semiconductor layer 130 may be disposed to contact the first bit line structure 110a and the source line structure 120, respectively.

The semiconductor layer 130 may be made of or include a semiconductor material. As an example, the semiconductor material may include silicon (Si), germanium (Ge), gallium arsenide (GaAs), or the like. As another example, the semiconductor material may include a two-dimensional semiconductor material. The two-dimensional semiconductor material may include transition metal dichalcogenide (TMDC), black phosphorous, or the like. The transition metal dichalcogenide (TMDC) may include, for example, molybdenum selenide (MoSe2), hafnium selenide (HfSe2), indium selenide (InSe), gallium selenide (GaSe), or the like. As an example, the semiconductor material may be made of or include metal oxide such as indium-gallium-zinc oxide (IGZO). The semiconductor layer 130 may be doped with an n-type or p-type dopant. The electrical conductivity of the semiconductor layer 130 may vary depending on the amount of the dopant.

The semiconductor layer 130 may include a source region 132 in contact with the first bit line structure 110a, a drain region 134 in contact with the source line structure 120, and a channel region 136 disposed between the source region 132 and the drain region 134. The source region 132 and the drain region 134 may be doped with the same type of dopant. The channel region 136 may be doped with a different type of dopant from the source region 132 and the drain region 134. As an example, the source region 132 and the drain region 134 may be doped with an n-type dopant, and the channel region 136 may be doped with a p-type dopant. As another example, the source region 132 and the drain region 134 may be doped with a p-type dopant, and the channel region 136 may be doped with an n-type dopant.

The semiconductor layer 130 may have, facing each other, a first surface 130S1 and a second surface 130S2. A first interfacial insulating layer 140U may be disposed on the first surface 130S1 of the semiconductor layer 130. A first ferroelectric layer 150U may be disposed on the first interfacial insulating layer 140U. A first gate electrode layer 160U may be disposed on the first ferroelectric layer 150U.

The first interfacial insulating layer 140U may be made of or include an insulating material. As an example, the first interfacial insulating layer 140U may be made of or include oxide, nitride, oxynitride, or a combination of two or more thereof. The first interfacial insulating layer 140U may have an amorphous crystal state. The first interfacial insulating layer 140U may serve to reduce interfacial defects that occur when the semiconductor layer 130 and the first ferroelectric layer 150U directly form an interface. In some embodiments, when interfacial stability between the semiconductor layer 130 and the first ferroelectric layer 150U is secured, the first interfacial insulating layer 140U may be omitted.

The first ferroelectric layer 150U may be made of or include a ferroelectric material having remanent polarization. The first ferroelectric layer 150U may include crystalline metal oxide. The first ferroelectric layer 150U may include binary metal oxide. The first ferroelectric layer 150U may include, for example, hafnium oxide, zirconium oxide, hafnium zirconium oxide, or a combination of two or more thereof. In another embodiment, the first ferroelectric layer 150U may include a ternary or higher metal oxide. The first ferroelectric layer 150U may include, for example, $Pb(Zr,Ti)O_3$, $SrBi_2Ta_2O_9$, $(Bi,La)_4Ti_3O_{12}$, $BiFeO_3$, or a combination of two or more thereof.

The first gate electrode layer 160U may be made of or include a conductive material. The first gate electrode layer 160U may include, for example, tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof.

Although not illustrated in FIGS. 2A and 2B, in some embodiments, the first gate electrode layer 160U may extend in a second direction that is not parallel to the first direction. Specifically, the first gate electrode layer 160U may extend in a direction perpendicular to the first direction, which is a direction in which first bit line structure 110a and the source line structure 120 extend. The first gate electrode layer 160U may extend in second direction (e.g., y-direction) on a plane parallel to the surface 101S of the substrate 101. For example, the first gate electrode layer 160U may function as a word line.

Referring again to FIG. 2B, a first bit line insulating layer 182U and a first source line insulating layer 184U may be disposed on the first ferroelectric layer 150U. The first bit line insulating layer 182U and the first source line insulating layer 184U may be disposed on sidewalls of the first gate electrode layer 160U. The first bit line insulating layer 182U may electrically insulate the first bit line structure 110a from the first gate electrode layer 160U in the lateral direction (i.e., corresponding to the x-direction of FIG. 2A). The first source line insulating layer 184U may electrically insulate the source line structure 120 from the first gate electrode layer 160U in the lateral direction (i.e., corresponding to the x-direction of FIG. 2A). Each of the first bit line insulating layer 182U and the first source line insulating layer 184U may be made of or include, for example, oxide, nitride, oxynitride, or a combination of two or more thereof.

A first cover dielectric layer 170U may be disposed on the first gate electrode layer 160U, the first bit line insulating layer 182U, and the first source line insulating layer 184U. In an embodiment, the first cover dielectric layer 170U may contact the first gate electrode layer 160U, the first bit line insulating layer 182U, and the first source line insulating layer 184U. In an embodiment, the first cover dielectric layer 170U may be made of substantially the same material as the first ferroelectric layer 150U. That is, the first cover dielectric layer 170U may be made of or include a ferroelectric material having remanent polarization. An interlayer insulating layer 190 may be disposed on the first cover dielectric layer 170U. The interlayer insulating layer 190 may be made of or include, for example, oxide, nitride, oxynitride, or a combination of two or more thereof.

Referring again to FIG. 2B, a second interfacial insulating layer 140L may be disposed on a second surface 130S2 of the semiconductor layer 130. A second ferroelectric layer 150L may be disposed on the second interfacial insulating layer 140L. A second gate electrode layer 160L may be disposed on the second ferroelectric layer 150L. The configurations of the second interface insulating layer 140L, the second ferroelectric layer 150L, and the second gate electrode layer 160L may be substantially the same as those of the first interfacial insulating layer 140U, the first ferroelectric layer 150U, and the first gate electrode layer 160U.

In addition, a second bit line insulating layer 182L and a second source line insulating layer 184L may be disposed on sidewalls of the second gate electrode layer 160L. The second bit line insulating layer 182L may electrically insulate the first bit line structure 110a from the second gate electrode layer 160L in the lateral direction (i.e., corresponding to the x-direction of FIG. 2A). The second source line insulating layer 184L may electrically insulate the source line structure 120 from the second gate electrode layer 160L in the lateral direction (i.e., corresponding to the x-direction of FIG. 2A). The configuration of the second bit line insulating layer 182L may be substantially the same as the configuration of the first bit line insulating layer 182U, and the configuration of the second source line insulating layer 184L may be substantially the same as that of the first source line insulating layer 184U.

A second cover dielectric layer 170L may be disposed on the second gate electrode layer 160L, the second bit line insulating layer 182L, and the second source line insulating layer 184L. The configuration of the second cover dielectric layer 170L may be substantially the same as that of the first cover dielectric layer 170U. An interlayer insulating layer 190 may be disposed on the second cover dielectric layer 170L.

In an embodiment, although not illustrated in FIGS. 2A and 2B, the first gate electrode layer 160U and the second gate electrode layer 160L may be electrically connected to each other. As an example, the first gate electrode layer 160U and the second gate electrode layer 160L may be connected to each other through a conductive via (not illustrated), which is disposed in a direction perpendicular to the surface 101S of the substrate 101. Accordingly, in the first unit cell structure UC10, the first and second gate electrode layers 160U and 160L may simultaneously control the polarization of the first and second ferroelectric layers 150U and 150L by simultaneously applying the same gate voltage to the first and second ferroelectric layers 150U and 150L. Accordingly, the same electrical signal may be stored in the first and second ferroelectric layers 150U and 150L. As a result, the first unit cell structure U10 may operate as a single memory cell.

In another embodiment, the first and second gate electrode layers 160U and 160L may be electrically separated from each other. In the first unit cell structure UC10, the first and second gate electrode layers 160U and 160L may control polarization of each of the first and second ferroelectric layers 150U and 150L by applying gate voltages to the first and second ferroelectric layers 150U and 150L independently of each other. Accordingly, separate electrical signals may be stored in the first and second ferroelectric layers 150U and 150L. As a result, the first unit cell structure U10 may operate as two memory cells.

Figure 3A:
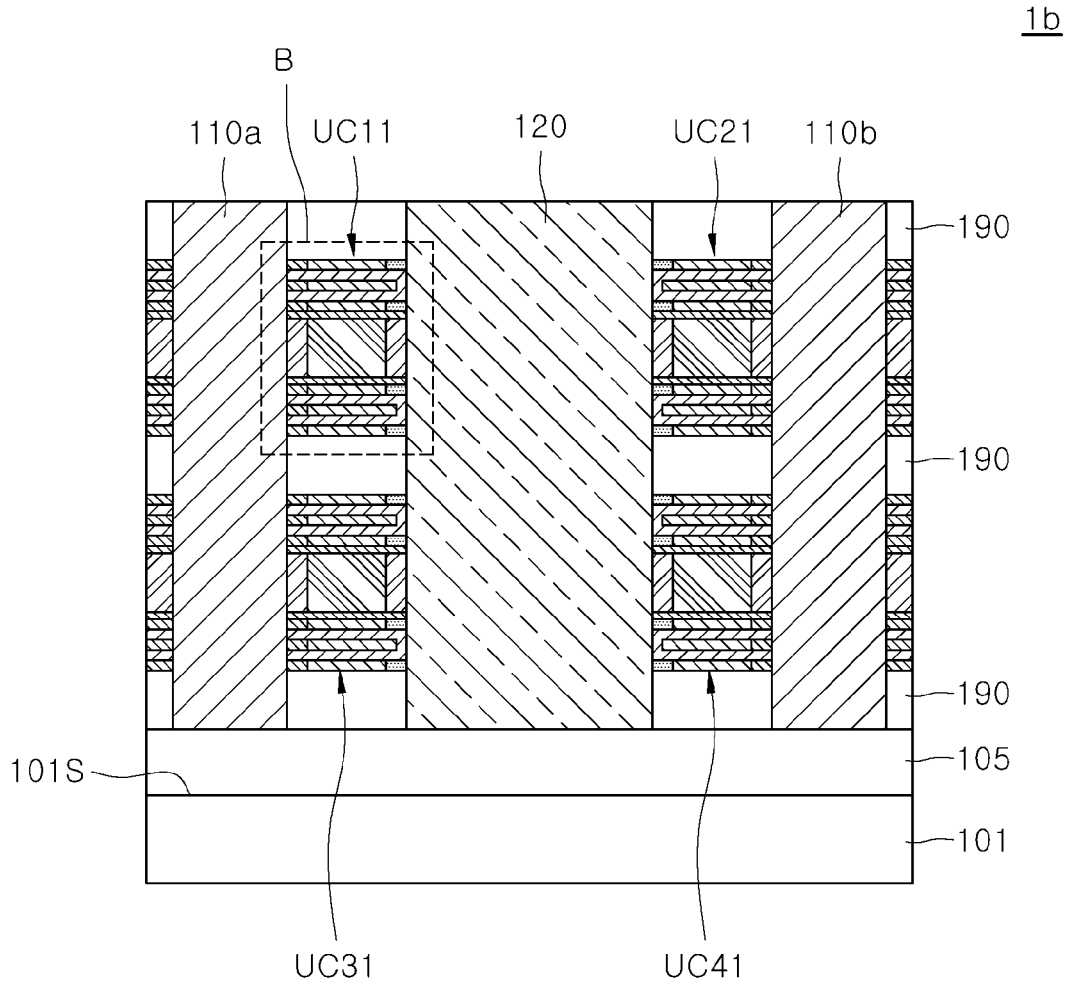
FIG. 3A is a schematic cross-sectional view illustrating a semiconductor device according to another embodiment of the present disclosure.
Figure 3A:
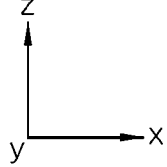
Figure 3B:
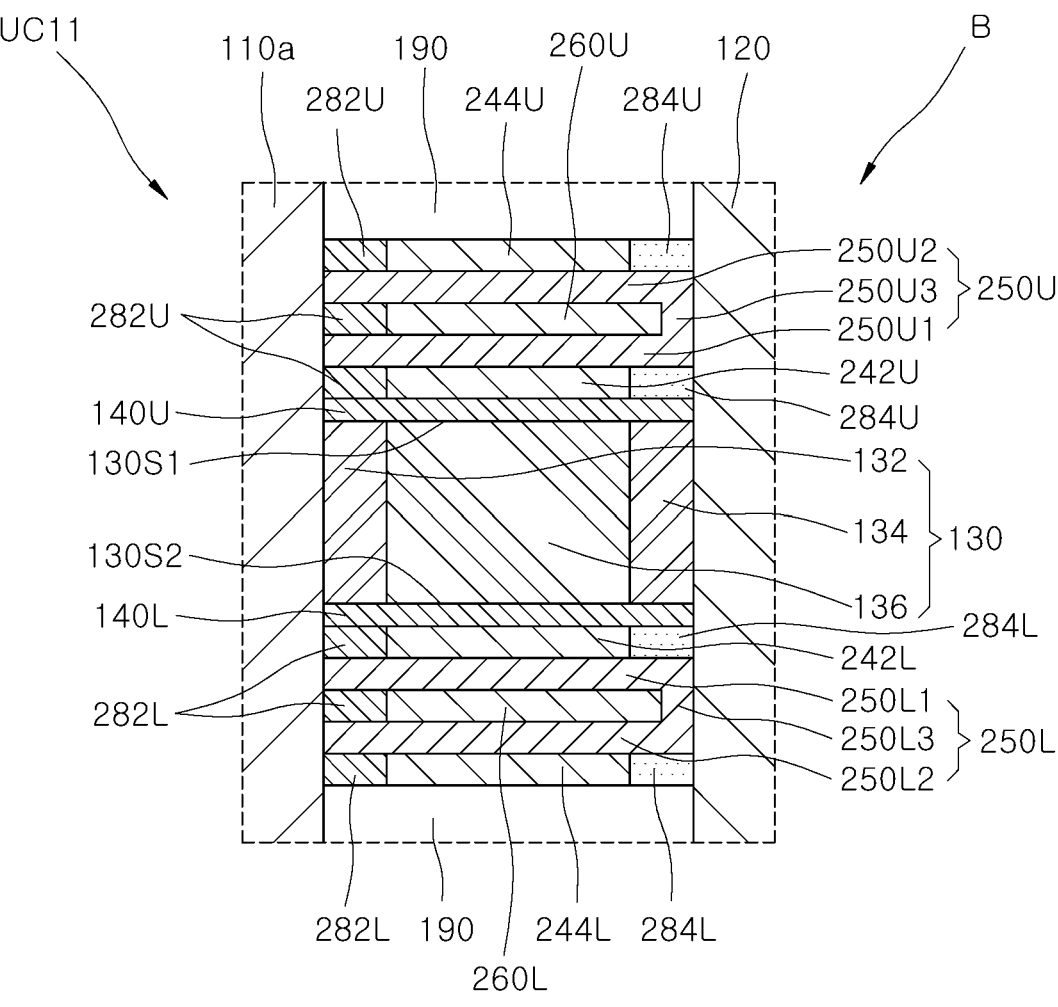
FIG. 3B is an enlarged view of portion "B" of a semiconductor device of FIG. 3A.

FIG. 3A is a schematic cross-sectional view of a semiconductor device according to another embodiment of the present disclosure. FIG. 3B is an enlarged view of portion "B" of a semiconductor device of FIG. 3A. Compared to the semiconductor device 1a of FIGS. 2A and 2B, a semiconductor device 1b differs in configurations of the first to fourth unit cell structures, namely, UC11, UC21, UC31, and UC41. In FIG. 3A, some elements are substantially the same as like-numbered counterparts in FIG. 2A and therefore some descriptive details may be omitted below.

Referring to FIG. 3A, the first to fourth unit cell structures UC11, UC21, UC31, and UC41 of the semiconductor device 1b may correspond to the first to fourth unit cells MC1, MC2, MC3, and MC4 in the circuit diagram of FIG. 1. The configurations of the first to fourth unit cell structures UC11, UC21, UC31, and UC41 may be substantially the same as each other. Hereinafter, the first unit cell structure UC11 from among the first to fourth unit cell structures UC11, UC21, UC31, and UC41 will be described in detail with reference to FIG. 3B.

Referring to FIGS. 3A and 3B, a semiconductor layer 130 may be disposed on a plane parallel to a surface 101S of a substrate 101 on a base insulating layer 105. As an example, the plane parallel to a surface 101S of the substrate 101 may be a plane perpendicular to a first direction (i.e., z-direction).

The semiconductor layer 130 may include a source region 132 in contact with a first bit line structure 110a, a drain region 134 in contact with a source line structure 120, and a channel region 136 disposed between the source region 132 and the drain region 134.

A first interfacial insulating layer 140U may be disposed on a first surface 130S1 of the semiconductor layer 130. A first electrically floating layer 242U may be disposed on the first interfacial insulating layer 140U. A first ferroelectric layer 250U may be disposed on the first electrically floating layer 242U. The first ferroelectric layer 250U may have a shape of "⊃", such as for example a rotated horseshoe shape. The first ferroelectric layer 250U may include a first portion 250U1, a second portion 250U2, and a third portion 250U3. The first portion 250U1 and the second portion 250U2 may be disposed to be spaced apart from each other in the z-direction, and the third portion 250U3 may connect the first portion 250U1 and the second portion 250U2 to each other. A first gate electrode layer 260U may be disposed between the first portion 250U1 and the second portion 250U2 of the first ferroelectric layer 250U. A first cover conductive layer 244U may be disposed on the second portion 250U2 of the first ferroelectric layer 250U.

The first electrically floating layer 242U may have electrical conductivity. The first electrically floating layer 242U may be made of or include a conductive material. The conductive material may include, for example, metal, conductive metal nitride, conductive metal oxide, or the like. The first electrically floating layer 242U may be electrically floating in the first unit cell structure UC11.

The first electrically floating layer 242U may form an interface with the first portion 250U1 of the first ferroelectric layer 250U. Meanwhile, when ferroelectric polarization is formed in the first portion 250U1 of the first ferroelectric layer 250U, electric charges induced by the ferroelectric polarization may be distributed inside the first portion 250U1 adjacent to the interface with the first electrically floating layer 242U. The first electrically floating layer 242U may provide a sufficient amount of electric charges of opposite polarities to screen the induced electric charges in an inner region of the first electrically floating layer 242U adjacent to the interface. Accordingly, the electric charges induced in the first ferroelectric layer 250U due to the ferroelectric polarization may be offset by the electric charges provided by the first electrically floating layer 242U. As a result, it is possible to prevent the occurrence of a depolarization electric field in the first ferroelectric layer 250U by the electric charges induced by the ferroelectric polarization. Thereby, it is possible to prevent the ferroelectric polarization of the first ferroelectric layer 250U from deteriorating because of the depolarization electric field.

The first electrically floating layer 242U may be electrically insulated from the first bit line structure 110a by a first bit line insulating layer 282U. The first electrically floating layer 242U may be electrically insulated from the source line structure 120 by a first source line insulating layer 284U.

Referring again to FIG. 3B, the first portion 250U1 of the first ferroelectric layer 250U may cover the first electrically floating layer 242U. The first portion 250U1 may substantially perform a function of storing ferroelectric polarization as signal information. The ferroelectric polarization may be controlled by a gate voltage that is provided by the first gate electrode layer 260U and applied between the first gate electrode layer 260U and the semiconductor layer 130.

The second portion 250U2 of the first ferroelectric layer 250U may be disposed between the first gate electrode layer 260U and the first cover conductive layer 244U. The third portion 250U3 of the first ferroelectric layer 250U may be disposed on a sidewall surface of the source line structure 120 to connect the first portion 250U1 and the second portion 250U2 to each other. In an embodiment, the second and third portions 250U2 and 250U3 might not be electrically controlled by a gate voltage provided by the first gate electrode layer 260U between the first gate electrode layer 260U and the semiconductor layer 130. Accordingly, the second and third portions 250U2 and 250U3 might not substantially perform a memory function of storing the ferroelectric polarization as signal information between the first gate electrode layer 260U and the semiconductor layer 130.

The material constituting the first to third portions 250U1, 250U2, and 250U3 of the first ferroelectric layer 250U may be substantially the same as the material constituting the first ferroelectric layer 150U described above with reference to FIGS. 2A and 2B.

The first gate electrode layer 260U may be disposed, in the z-direction, between the first portion 250U1 and the second portion 250U2 of the first ferroelectric layer 250U. In addition, the first gate electrode layer 260U may be disposed, in the x-direction, between a first bit line insulating layer 282U and the third portion 250U3 of the first ferroelectric layer 250U. The material constituting the first gate electrode layer 260U may be substantially the same as the material constituting the first gate electrode layer 160U described above with reference to FIGS. 2A and 2B. The first gate electrode layer 260U may be electrically insulated from the first bit line structure 110a by the first bit line insulating layer 282U.

Although not illustrated in FIGS. 3A and 3B, in some embodiments, the first gate electrode layer 260U may extend in a second direction that is not parallel to the first direction (i.e., z-direction). Specifically, the first gate electrode layer 260U may extend in a direction perpendicular to the first direction, which is a direction in which first bit line structure 110a and the source line structure 120 extend. The first gate electrode layer 260U may extend in a second direction (e.g., y-direction) on a plane parallel to the surface 101S of the substrate 101. The first gate electrode layer 260U may function as a word line.

The first cover conductive layer 244U may be disposed to contact the second portion 250U2 of the first ferroelectric layer 250U. The first cover conductive layer 244U may be made of or include a conductive material. In an embodiment, the first cover conductive layer 244U may be electrically floating. The first cover conductive layer 244U may be electrically insulated from the first bit line structure 110a by a first bit line insulating layer 282U. The first cover conductive layer 244U may be electrically insulated from the source line structure 120 by a first source line insulating layer 284U. An interlayer insulating layer 190 may be disposed on the first cover conductive layer 244U. The interlayer insulating layer 190 may be disposed to contact the first cover conductive layer 244U, the first bit line insulating layer 282U, and the first source line insulating layer 284U.

Referring again to FIG. 3B, a second interfacial insulating layer 140L may be disposed on a second surface 130S2 of the semiconductor layer 130. A second electrically floating layer 242L may be disposed on the second interfacial insulating layer 140L. A second ferroelectric layer 250L may be disposed on the second electrically floating layer 242L. The second ferroelectric layer 250L may have a shape of '⊃', such as a rotated horseshoe shape. The second ferroelectric layer 250L may include a first portion 250L1, a second portion 250L2, and a third portion 250L3. The first portion 250L1 and the second portion 250L2 may be disposed to be spaced apart from each other in the z-direction, and the third portion 250L3 may connect the first portion 250L1 and the second portion 250L2 to each other. A second gate electrode layer 260L may be disposed between the first portion 250L1 and the second portion 250L2 of the second ferroelectric layer 250L. A second cover conductive layer 244L may be disposed on the second portion 250L2 of the second ferroelectric layer 250L.

Second bit line insulating layers 282L may be disposed between the first bit line structure 110a and each of the second electrically floating layer 242L, the second gate electrode layer 260L, and the second cover conductive layer 244L. Second source line insulating layers 284L may be disposed between the source line structure 120 and each of the second electrically floating layer 242L and the second cover conductive layer 244L.

An interlayer insulating layer 190 may be disposed on the second cover conductive layer 244L. The interlayer insulating layer 190 may be disposed to contact the second cover conductive layer 244L, the second bit line insulating layer 282L, and the second source line insulating layer 284L.

The configurations of the second interfacial insulating layer 140L, the second electrically floating layer 242L, the second ferroelectric layer 250L, the second gate electrode layer 260L, the second cover conductive layer 244L, the second bit line insulating layer 282L, and the second source line insulating layer 284L may be substantially the same as the configurations of the first interfacial insulating layer 140U, the first electrically floating layer 242U, the first ferroelectric layer 250U, the first gate electrode layer 260U, the first cover conductive layer 244U, the first bit line insulating layer 282U, and the first source line insulating layer 284U.

In an embodiment, although not illustrated in FIGS. 3A and 3B, the first gate electrode layer 260U and the second gate electrode layer 260L may be electrically connected to each other. As an example, the first gate electrode layer 260U and the second gate electrode layer 260L may be connected to each other through a conductive via (not illustrated) disposed in a direction perpendicular to the surface 101S of the substrate 101. The first and second gate electrode layers 260U and 260L provide the same gate voltage to simultaneously control the polarization of the first and second ferroelectric layers 250U and 250L, so that the first unit cell structure UC11 may operate as a single memory cell.

In another embodiment, the first and second gate electrode layers 260U and 260L may be electrically separated from each other. The first and second gate electrode layers 260U and 260L each provide a gate voltage to independently control the polarization of the corresponding first and second ferroelectric layers 250U and 250L, so that the first unit cell structure UC11 may operate as two memory cells.

Figure 4A:
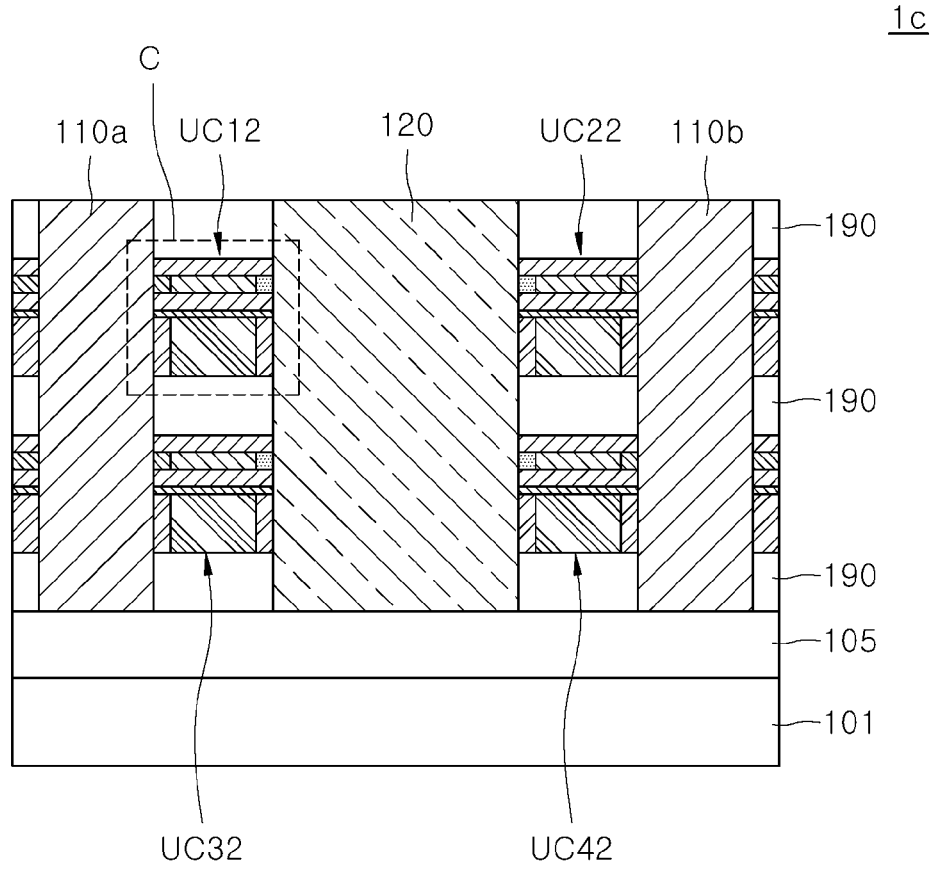
FIG. 4A is a schematic cross-sectional view illustrating a semiconductor device according to yet another embodiment of the present disclosure.
Figure 4A:
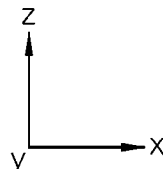
Figure 4B:
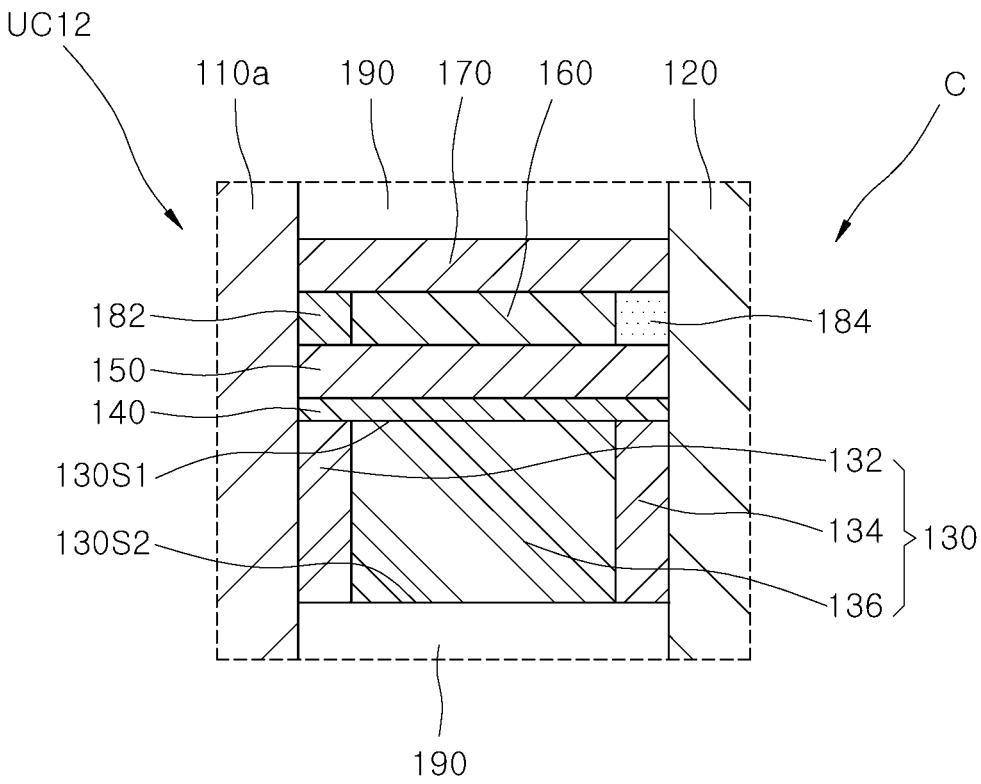
FIG. 4B is an enlarged view of portion "C" of a semiconductor device of FIG. 4A.

FIG. 4A is a schematic cross-sectional view illustrating a semiconductor device according to yet another embodiment of the present disclosure. FIG. 4B is an enlarged view of portion "C" of a semiconductor device of FIG. 4A. Compared to the semiconductor device 1a of FIGS. 2A and 2B, a semiconductor device 1c differs in configurations of first to fourth unit cell structures, namely, UC12, UC22, UC32, and UC42. In FIG. 4A, some elements are substantially the same as like-numbered counterparts in FIG. 2A and therefore some descriptive details may be omitted below.

Referring to FIG. 4A, the first to fourth unit cell structures UC12, UC22, UC32, and UC42 of the semiconductor device 1c may correspond to the first to fourth unit cells MC1, MC2, MC3, and MC4 in the circuit diagram of FIG. 1. The configurations of the first to fourth unit cell structures UC12, UC22, UC32, and UC42 may be substantially the same as each other. Hereinafter, among the first to fourth unit cell structures UC12, UC22, UC32, and UC42, the first unit cell structure UC12 will be described in detail with reference to FIG. 4B.

Referring to FIG. 4B, the first unit cell structure UC12 may include an interfacial insulating layer 140, a ferroelectric layer 150, a gate electrode layer 160, and a cover dielectric layer 170 that are disposed on a first surface 130S1 of a semiconductor layer 130. In addition, the first unit cell structure UC12 may include a bit line insulating layer 182 and a source line insulating layer 184 that are disposed on sidewalls of the gate electrode layer 160. The bit line insulating layer 182 and the source line insulating layer 184 are disposed only over the first surface 130S1 of the semiconductor layer 130. Interlayer insulating layers 190 may be disposed on a second surface 130S2 of the semiconductor layer 130 and on the cover dielectric layer 170.

The configurations of the interfacial insulating layer 140, the ferroelectric layer 150, the gate electrode layer 160, the cover dielectric layer 170, the bit line insulating layer 182, and the source line insulating layer 184 may be substantially the same as the configurations of the first interfacial insulating layer 140U, the first ferroelectric layer 150U, the first gate electrode layer 160U, the first cover dielectric layer 170U, the first bit line insulating layer 182U, and the first source line insulating layer 184U described with reference to FIGS. 2A and 2B.

As described above, in various embodiments of the present disclosure, each of the semiconductor devices may include unit cell structures disposed between the bit line structure and the source line structure, which extend in a vertical direction perpendicular to the surface of the substrate. The unit cell structure may be implemented as a field effect transistor-type ferroelectric device on a plane parallel to the surface of the substrate.

Because the field effect transistor-type ferroelectric device is disposed on a plane parallel to the surface of the substrate, the height of the unit cell structure along the direction perpendicular to the surface of the substrate may be reduced. Accordingly, the density of the unit cell structures that are vertically stacked in a fixed volume on the surface of the substrate may be increased. In addition, as the height of the unit cell structure decreases, when a plurality of unit cell structures are stacked on the substrate, the stress of the substrate may be reduced because the stress of the substrate depends on the heights of the plurality of unit cell structures.

FIGS. 5 to 19 are schematic cross-sectional views illustrating a method of manufacturing a semiconductor device according to an embodiment of the present disclosure. The methods described with reference to FIGS. 5 to 19 may be applied to a manufacturing method of the semiconductor device 1a described with reference to FIGS. 2A and 2B.

In an embodiment, the method of manufacturing a semiconductor device may include forming a first stack structure 10 (FIG. 5), forming a second stack structure 20 (FIGS. 6 and 7), forming a third stack structure 30 (FIGS. 8 to 13), forming a fourth stack structure 40 (FIG. 14), forming a fifth stack structure 50 (FIG. 15), and forming a sixth stack structure 60 (FIGS. 16 to 19).

Figure 5:
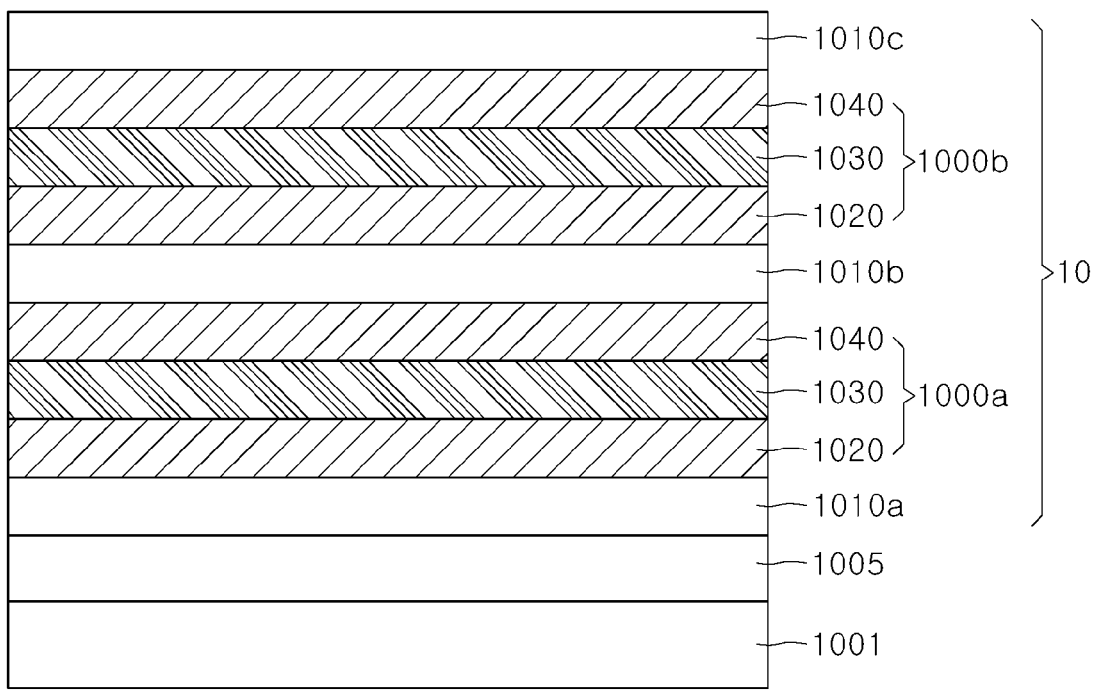
FIGS. 5 to 19 are schematic cross-sectional views illustrating a method of manufacturing a semiconductor device according to an embodiment of the present disclosure.
Figure 5:
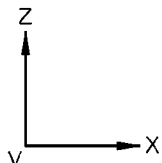

Referring to FIG. 5, a substrate 1001 may be provided. The substrate 1001 may be substantially the same as a substrate 101 described above with reference to FIGS. 2A and 2B.

Next, a base insulating layer 1005 may be formed on the substrate 1001. The base insulating layer 1005 may be substantially the same as a base insulating layer 105 described above with reference to FIGS. 2A and 2B. The base insulating layer 1005 may be formed by applying, for example, a chemical vapor deposition method, a sputtering method, an atomic layer deposition method, or the like.

Subsequently, a first insulating layer 1010a may be formed on the base insulating layer 1005. The first insulating layer 1010a may be formed of or include an insulating material. The insulating material may include, for example, oxide, nitride, or oxynitride. The first insulating layer 1010a may be formed by applying, for example, a chemical vapor deposition method, a sputtering method, an atomic layer deposition method, or the like.

Subsequently, a first sub-structure 1000a may be formed on the first insulating layer 1010a. The first sub-structure 1000a may include a first sacrificial layer 1020 formed on the first insulating layer 1010a, a semiconductor layer 1030 formed on the first sacrificial layer 1020, and a second sacrificial layer 1040 formed on the semiconductor layer 1030.

In an embodiment, the configurations of the first and second sacrificial layers 1020 and 1040 may be substantially the same as each other. For example, each of the first and second sacrificial layers 1020 and 1040 may have etching selectivity with respect to the base insulating layer 1005, the first insulating layer 1010a, and the semiconductor layer 1030. Each of the first and second sacrificial layers 1020 and 1040 may be formed of or include, for example, oxide, nitride, or oxynitride. The first and second sacrificial layers 1020 and 1040 may be formed by applying a chemical vapor deposition method, a sputtering method, an atomic layer deposition method, or the like.

In an embodiment, the semiconductor layer 1030 may be formed of or include a semiconductor material. As an example, the semiconductor material may include silicon (Si), germanium (Ge), gallium arsenide (GaAs), or the like. As another example, the semiconductor material may include a two-dimensional semiconductor material. The two-dimensional semiconductor material may include transition metal dichalcogenide (TMDC), black phosphorus, or the like. The transition metal dichalcogenide (TMDC) may include, for example, molybdenum selenide (MoSe2), hafnium selenide (HfSe2), indium selenide (InSe), gallium selenide (GaSe), or the like. The semiconductor material may include, for example, a metal oxide such as indium-gallium-zinc oxide (IGZO). The semiconductor layer 1030 may be doped with an n-type dopant or a p-type dopant. The electrical conductivity of the semiconductor layer 1030 may vary depending on the amount of the dopant. The semiconductor layer 1030 may be formed by applying, for example, a chemical vapor deposition method, a sputtering method, an atomic layer deposition method, or the like. In an embodiment, when the first insulating layer 1010a is an oxide layer, the first and second sacrificial layers 1020 and 1040 may be nitride layers, and the semiconductor layer 1030 may be a semiconductor material layer doped with a dopant.

Next, a second insulating layer 1010b may be formed on the first sub-structure 1000a. The configuration and method of manufacturing the second insulating layer 1010b may be substantially the same as the configuration and manufacturing method of the first insulating layer 1010a.

Consequently, a second sub-structure 1000b may be formed on the second insulating layer 1010b. The configuration of the second sub-structure 1000b may be substantially the same as the configuration of the first sub-structure 1000a. The second sub-structure 1000b may include a first sacrificial layer 1020 formed on the second insulating layer 1010b, a semiconductor layer 1030 formed on the first sacrificial layer 1020, and a second sacrificial layer 1040 formed on the semiconductor layer 1030. The method of manufacturing the second sub-structure 1000b may be substantially the same as the manufacturing method of the first sub-structure 1000a.

Subsequently, a third insulating layer 1010c may be formed on the second sub-structure 1000b. The configuration and method of manufacturing the third insulating layer 1010c may be substantially the same as the configuration and manufacturing method of the first insulating layer 1010a. The first stack structure 10 may be formed by performing the processes described above related to FIG. 5.

Figure 6:
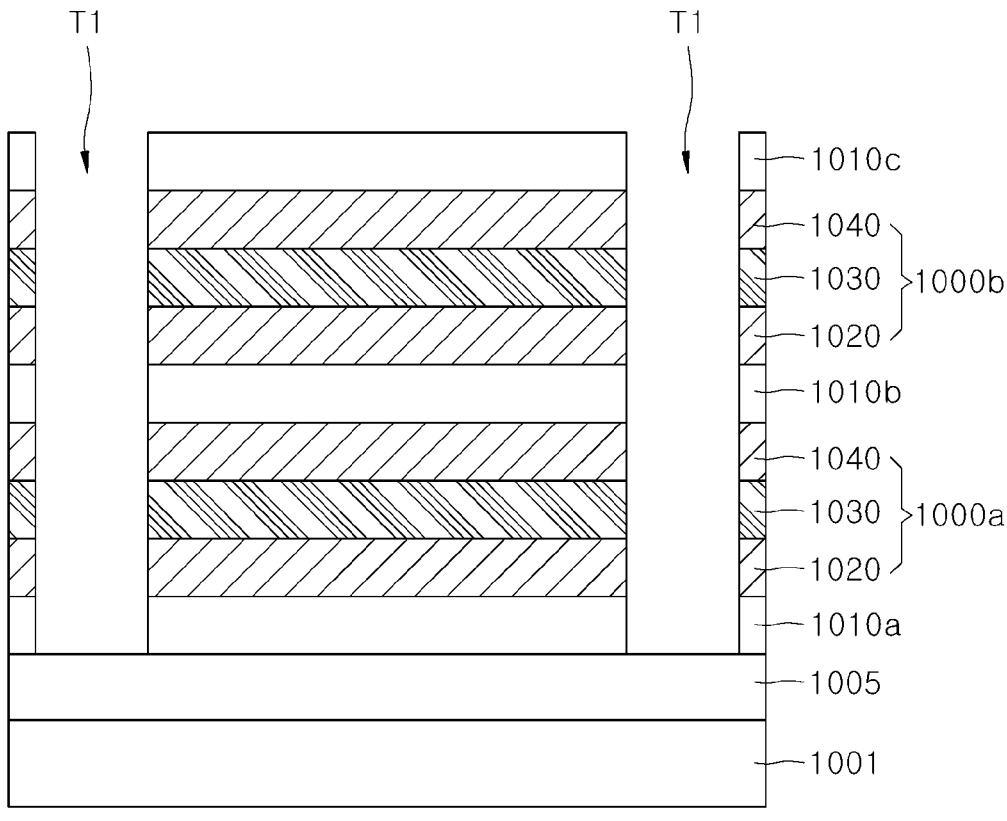
Figure 6:
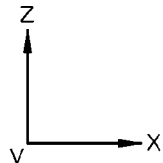

Referring to FIG. 6, first trenches T1 exposing the base insulating layer 1005 may be formed by selectively etching the first stack structure 10 of FIG. 5 on the base insulating layer 1005. The first trenches T1 may be formed by applying an anisotropic etching process. In an embodiment, each of the first trenches T1 may be a hole-shaped pattern.

Figure 7:
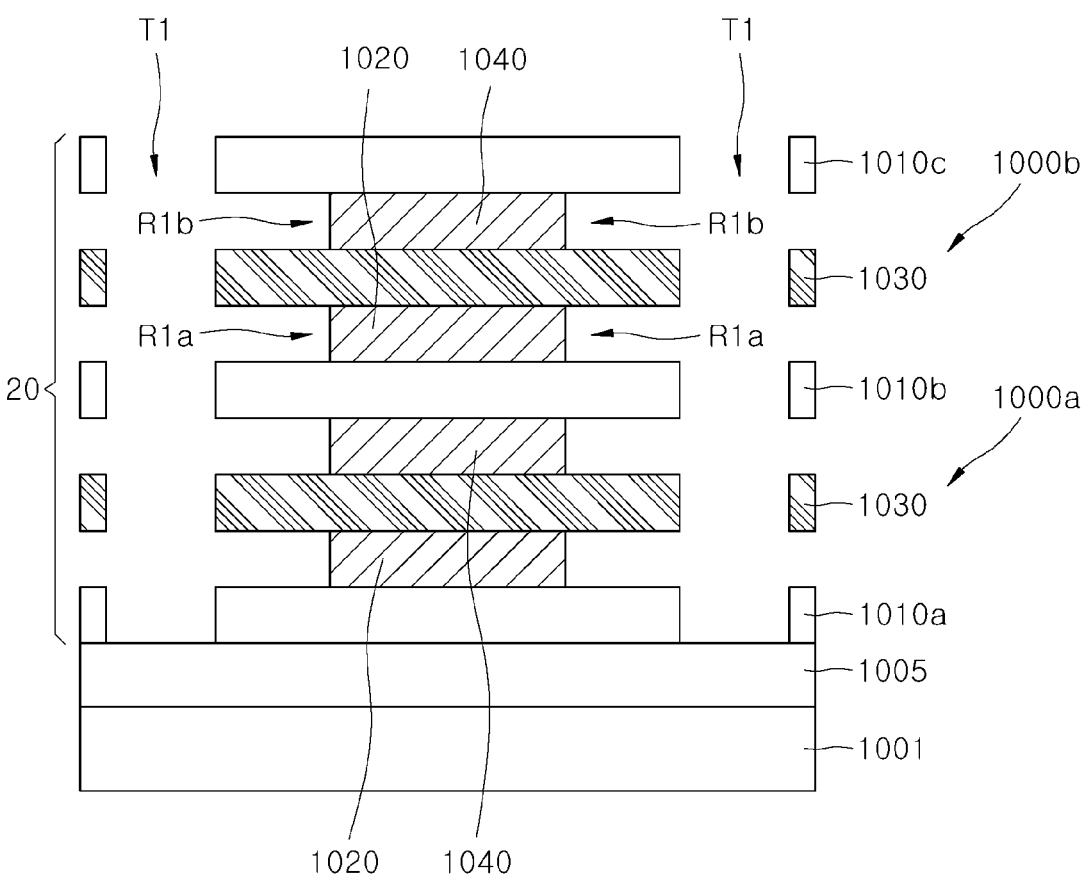
Figure 7:
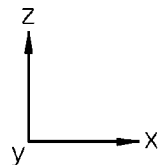

Referring to FIG. 7, the first and second sacrificial layers 1020 and 1040 may be selectively etched in the first trenches T1 to form first recess spaces R1a and R1b. The first recess spaces R1a and R1b may include first side spaces R1a formed by etching first sacrificial layers 1020 and second side spaces R1b formed by etching second sacrificial layers 1040.

In an embodiment, the first recess spaces R1a and R1b may be formed by providing an etchant into the first trenches T1 to isotropically etch the first and second sacrificial layers 1020 and 1040. The isotropic etching may be performed using the etching selectivity of the first and second sacrificial layers 1020 and 1040 with respect to the base insulating layer 1005, the semiconductor layer 1030, and the first to third insulating layers 1010a, 1010b, and 1010c. As described above, the second stack structure 20 may be formed by performing the processes related to FIGS. 6 and 7.

Figure 8:
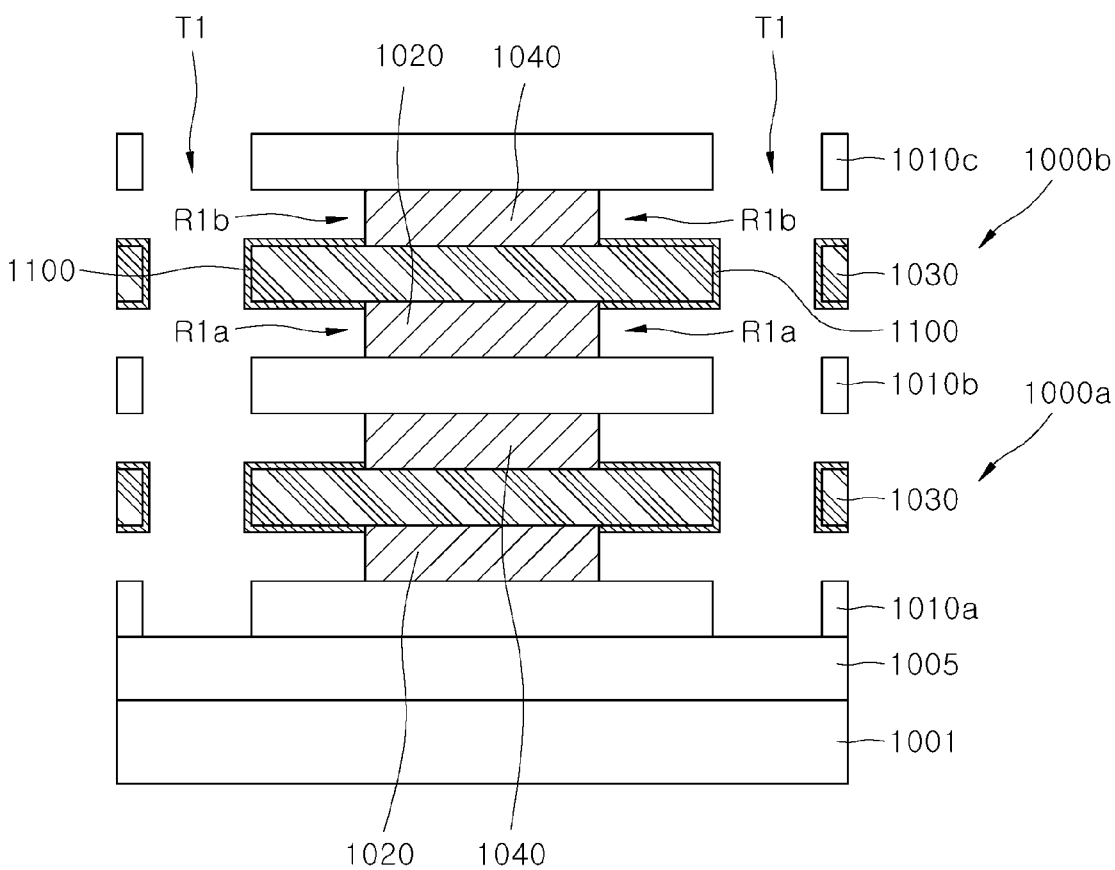
Figure 8:
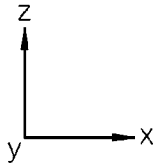

Referring to FIG. 8, interfacial insulating material layers 1100 may be formed on the semiconductor layers 1030. The interfacial insulating material layers 1100 may be formed of or include, for example, oxide, nitride, oxynitride, or the like. In an embodiment, the interfacial insulating material layers 1100 may be formed by a chemical vapor deposition method, a sputtering method, an atomic layer deposition method, or the like. In some embodiments, the interfacial insulating material layers 1100 may be formed by oxidizing the semiconductor layer 1030.

Figure 9:
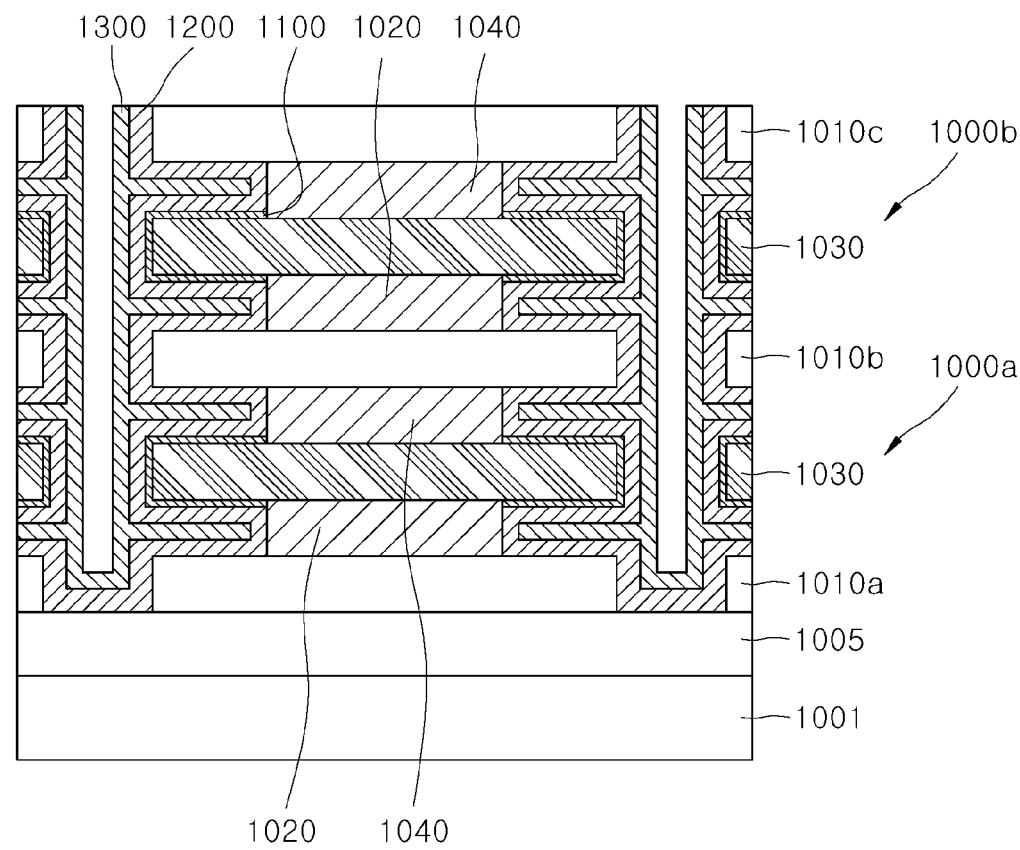
Figure 9:
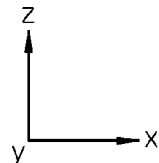

Referring to FIG. 9, a ferroelectric layer 1200 may be formed along inner surfaces of the first trenches T1. The ferroelectric layer 1200 may be formed of or include a ferroelectric material. In an embodiment, the ferroelectric material may include a binary metal oxide. As an example, the binary metal oxide may include hafnium oxide, zirconium oxide, hafnium zirconium oxide, or a combination of two or more thereof. In another embodiment, the ferroelectric material may include a ternary or higher metal oxide. The ternary or higher metal oxide may include, for example, $Pb(Zr,Ti)O_3$, $SrBi_2Ta_2O_9$, $(Bi,La)_4Ti_3O_{12}$, $BiFeO_3$, or a combination of two or more thereof. The ferroelectric layer 1200 may be formed by, for example, a chemical vapor deposition method, an atomic layer deposition method, or the like.

Subsequently, a gate electrode layer 1300 may be formed on the ferroelectric layer 1200. The gate electrode layer 1300 may be formed of or include, for example, a conductive material. The conductive material may include, for example, tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof. The gate electrode layer 1300 may be formed by, for example, a chemical vapor deposition method, an atomic layer deposition method, or the like.

Figure 10:
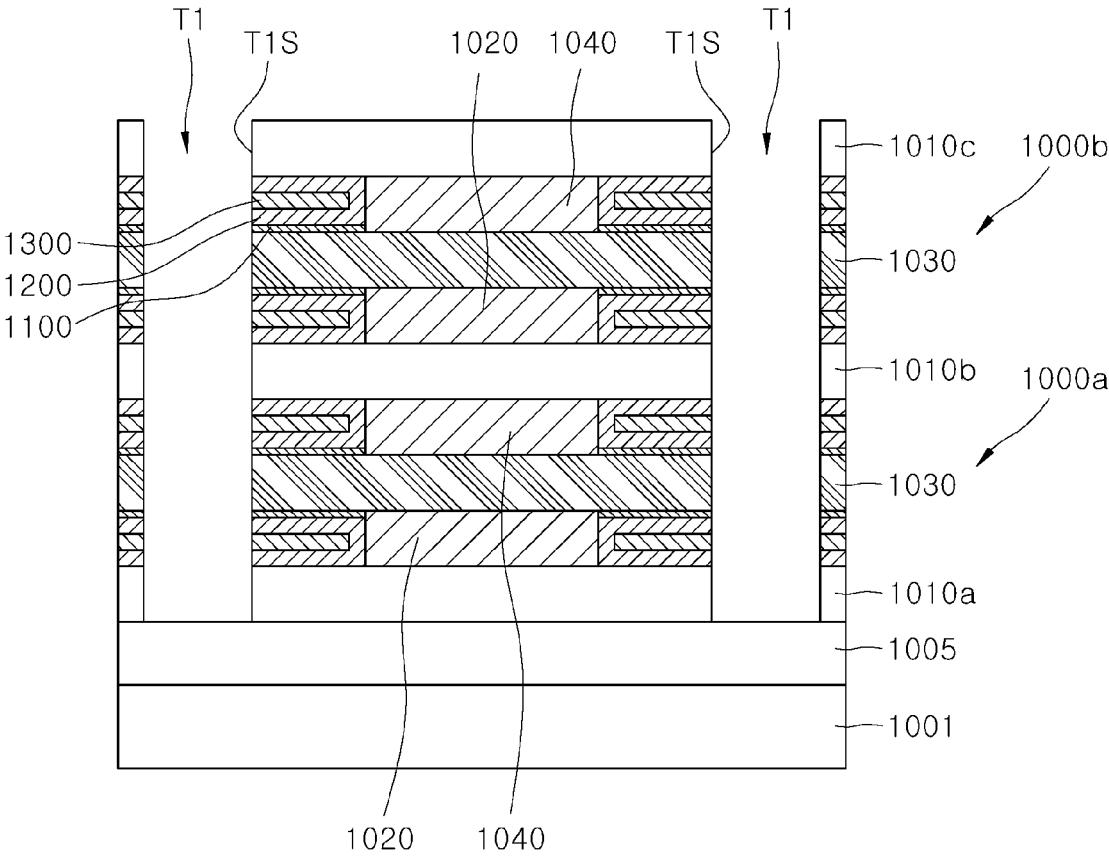
Figure 10:
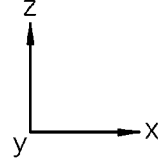

Referring to FIG. 10, the interfacial insulating layers 1100, the ferroelectric layer 1200, and the gate electrode layer 1300 in each of the first trenches T1 may be selectively removed by applying an anisotropic etching method. Accordingly, the interfacial insulating layers 1100, the semiconductor layers 1030, the ferroelectric layer 1200, the gate electrode layer 1300, and the first to third insulating layers 1010*a*, 1010*b*, and 1010*c* may be exposed to the sidewall surfaces T1S of the first trenches T1.

Figure 11:
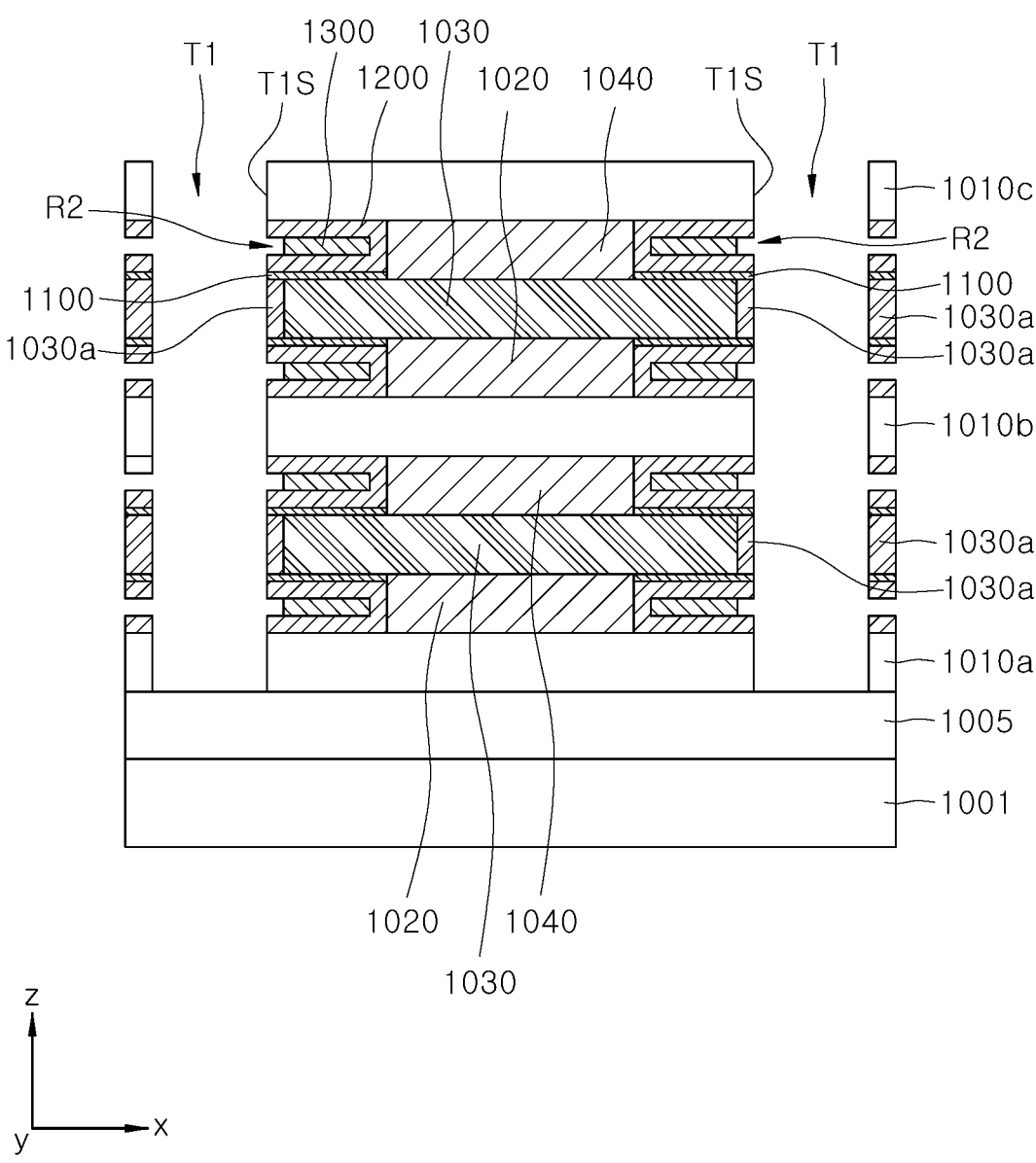

Referring to FIG. 11, the gate electrode layer 1300 exposed on the sidewall surfaces T1S of the first trenches T1 may be selectively etched to form second recess spaces R2. The second recess spaces R2 may be formed by applying an isotropic etching method. In addition, portions of the semiconductor layers 1030 exposed to the sidewall surfaces T1S of the first trenches T1 may be doped to form first semiconductor doped regions 1030*a*. The first semiconductor doped regions 1030*a* may be formed by implanting an n-type dopant or a p-type dopant using an ion implantation method.

Figure 12:
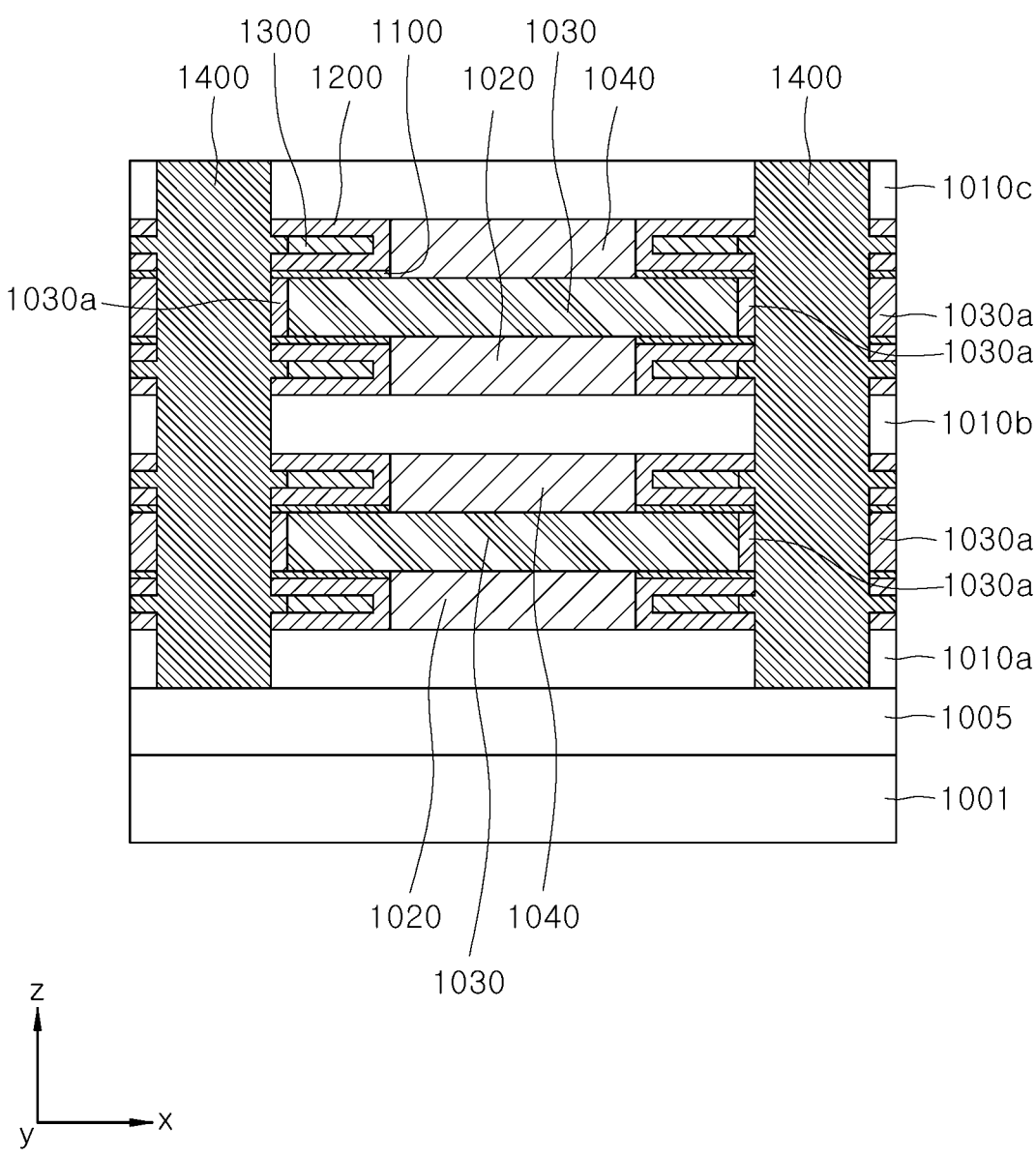
Figure 13:
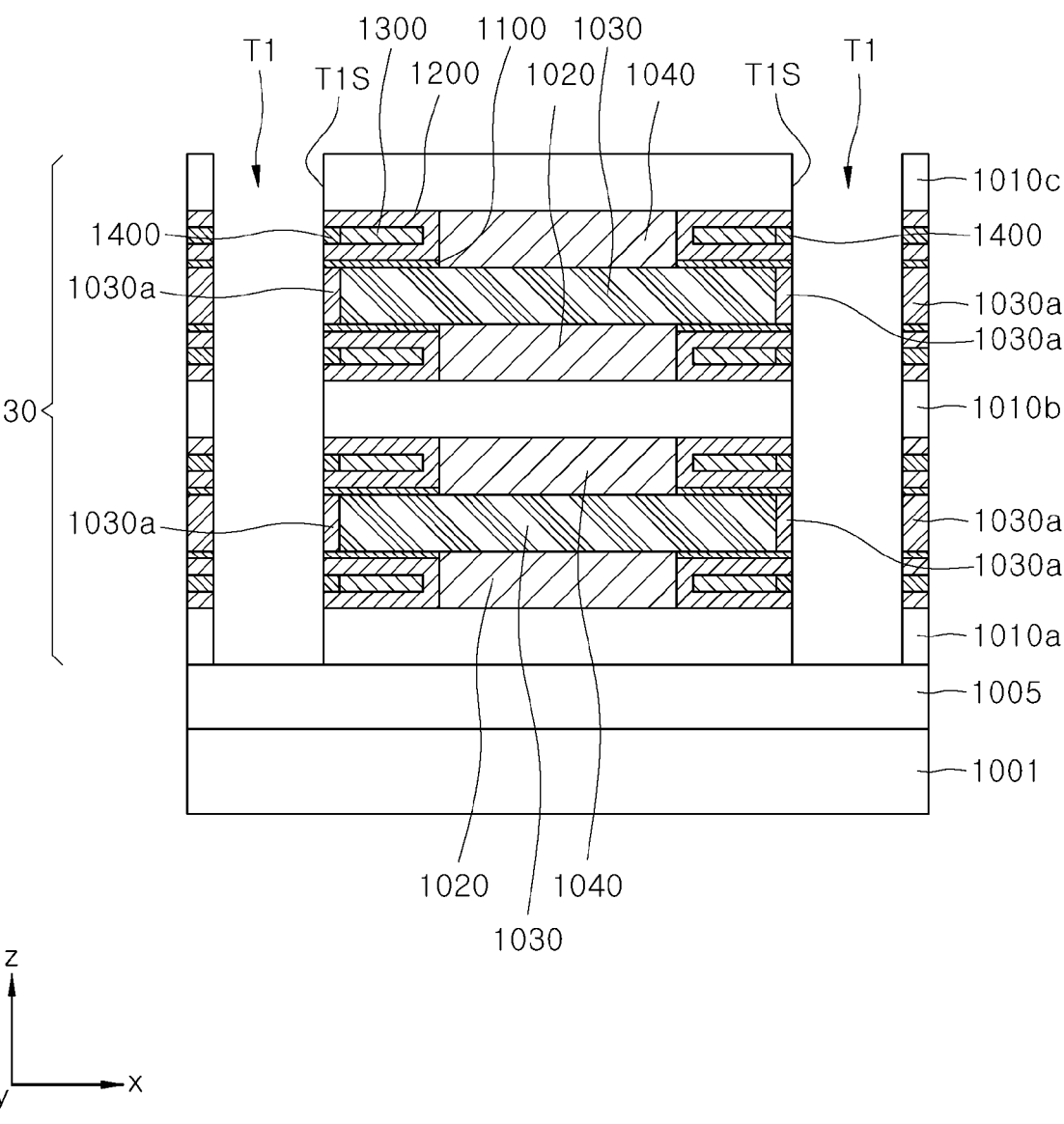

Referring to FIG. 12, the second recess spaces R2 and the first trenches T1 may be filled with an insulating material 1400. Referring to FIG. 13, the insulating material 1400 inside the first trenches T1 may be removed by applying an anisotropic etching method. Accordingly, the insulating material 1400 may remain in the second recess spaces R2. As described above, the third stack structure 30 may be formed by performing the processes related to FIGS. 8 to 13.

Figure 14:
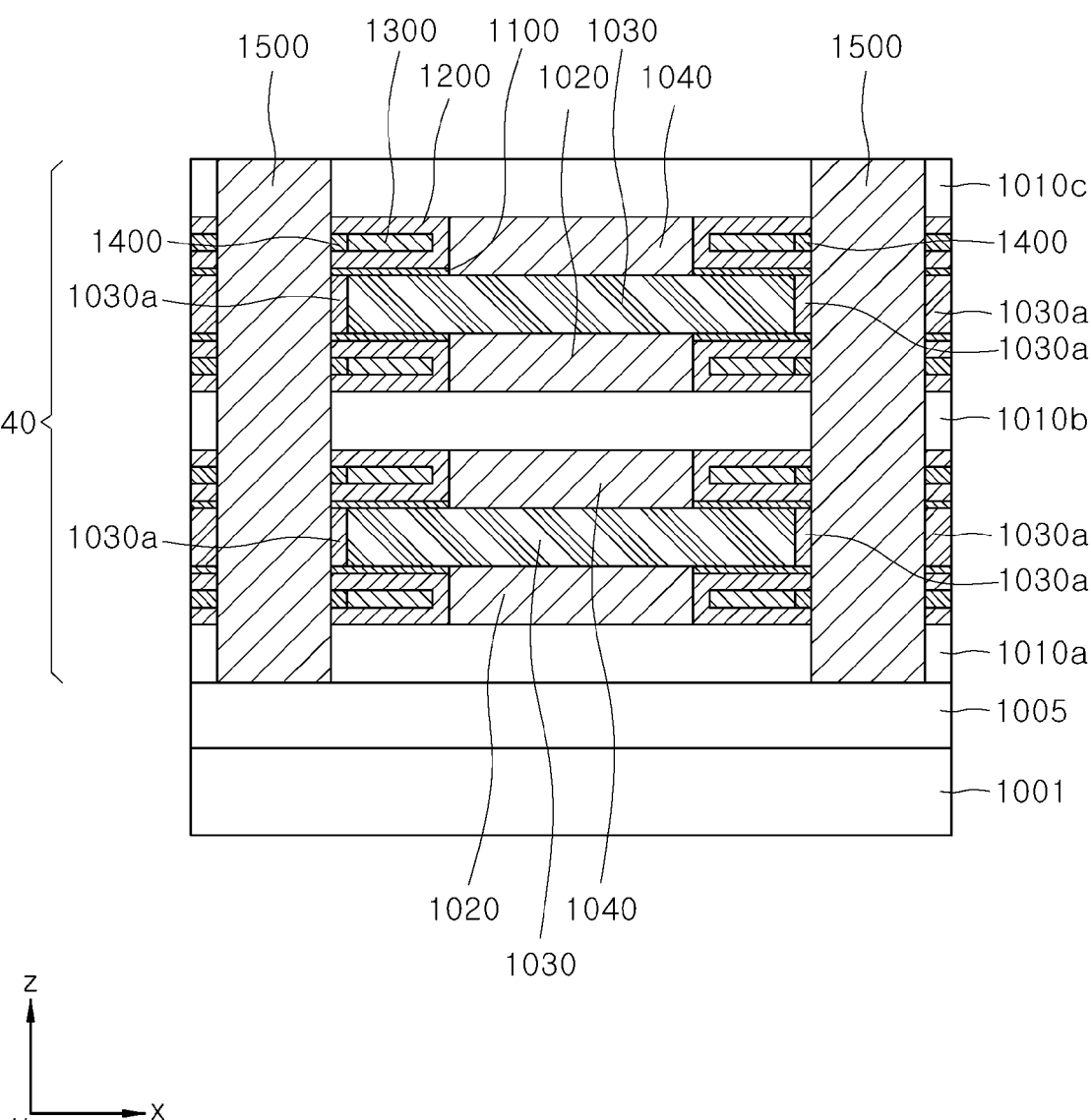

Referring to FIG. 14, the first trenches T1 in FIG. 13 may be filled with a conductive material to form bit line structures 1500. The bit line structures 1500 may be disposed to be spaced apart from the gate electrode layer 1300. For example, the bit line structures 1500 and the gate electrode layer 1300 may be electrically insulated from each other by the insulating material 1400. As described above, the fourth stack structure 40 including the bit line structures 1500 disposed inside the first trenches T1 may be formed by performing the processes related to FIG. 14.

Figure 15:
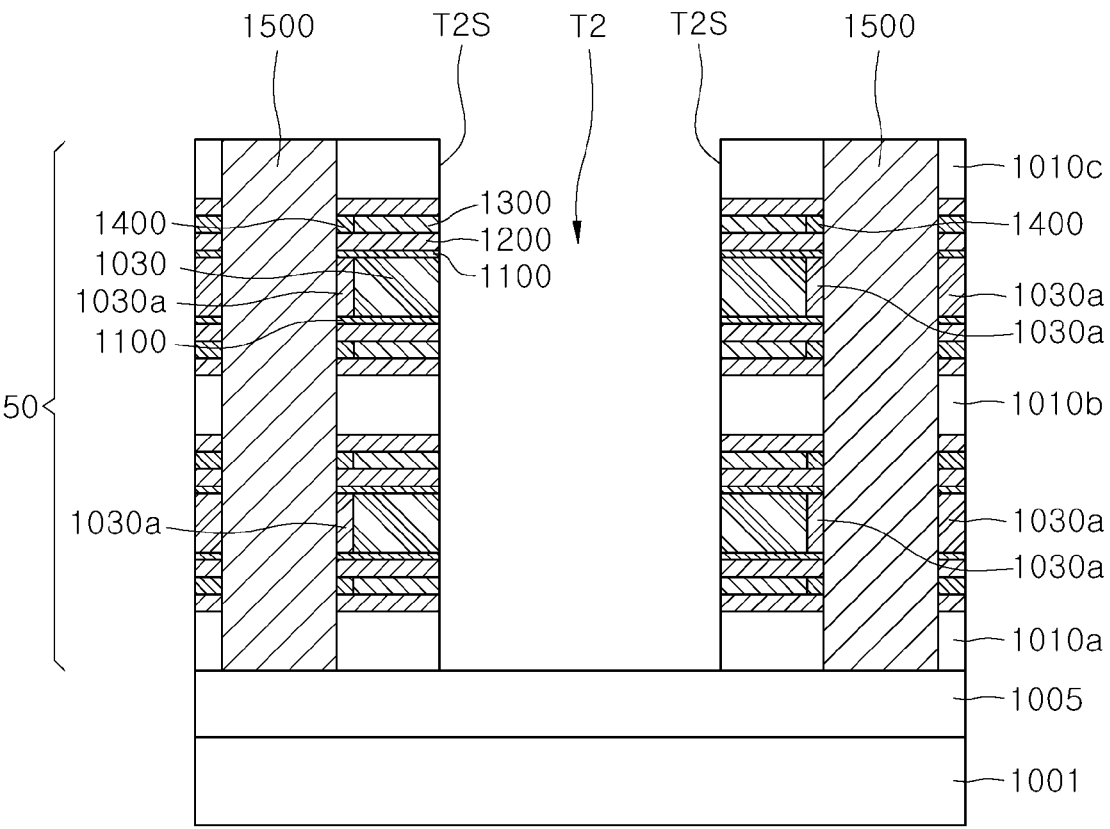
Figure 15:
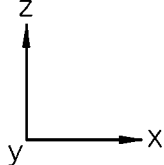

Referring to FIG. 15, the fourth stack structure 40 of FIG. 14 may be selectively etched to form a second trench T2 exposing the base insulating layer 1005. Specifically, the fourth stack structure 40 may be selectively etched using an anisotropic etching method. The second trench T2 may be disposed to be spaced apart from the bit line structures 1500.

The method of etching the fourth stack structure 40 by an anisotropic etching method may include removing portions of the first to third insulating layers 1010*a*, 1010*b*, and 1010*c*, the first and second sacrificial layers 1020 and 1040, and the semiconductor layers 1030, and removing portions of the interfacial insulating layers 1100, and the ferroelectric layers 1200 illustrated in FIG. 14.

Referring to FIG. 15, the second trench T2 may expose the semiconductor layers 1030, the interfacial insulating layers 1100, the ferroelectric layers 1200, the gate electrode layers 1300, and the first to third insulating layers 1010*a*, 1010*b*, and 1010*c* on the sidewall surface T2S of the second trench T2. As described above, the fifth stack structure 50 may be formed by performing the processes related to FIG. 15.

Figure 16:
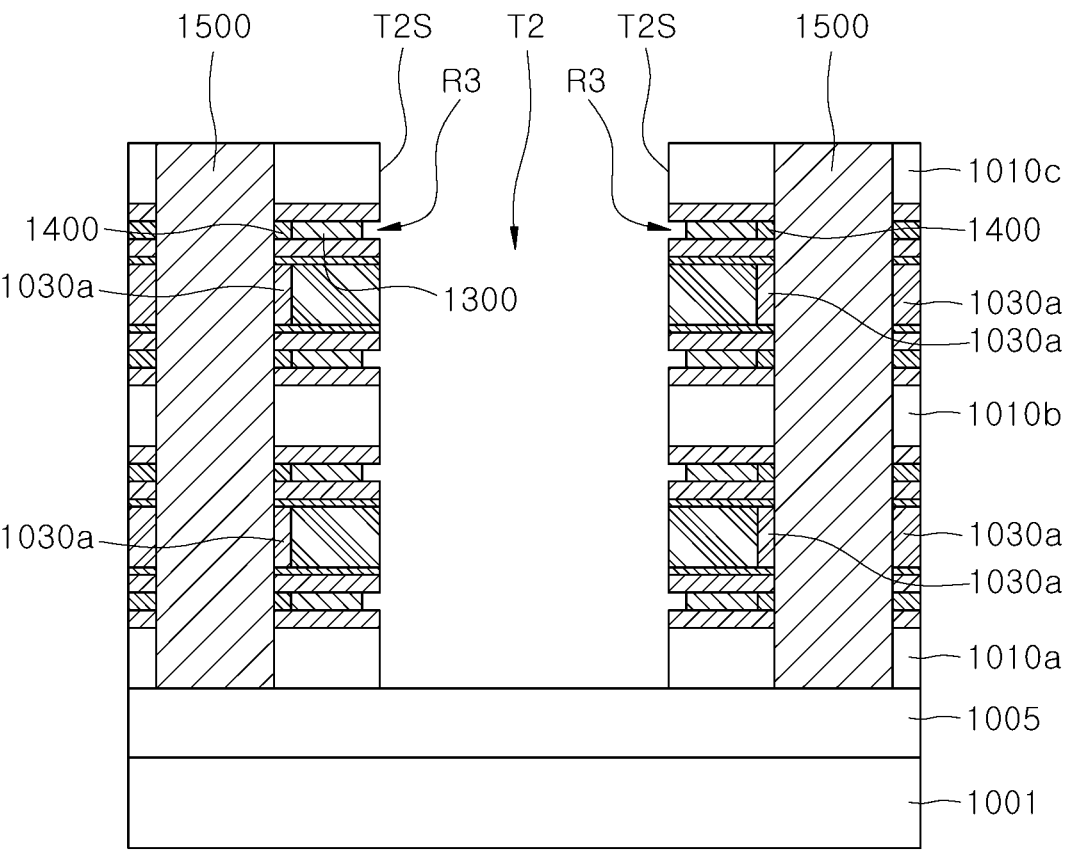
Figure 16:
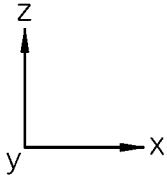

Referring to FIG. 16, the gate electrode layer 1300 exposed on the sidewall surface T2S of the second trench T2 may be selectively etched to form third recess spaces R3. The third recess spaces R3 may be formed by applying an isotropic etching method.

Figure 17:
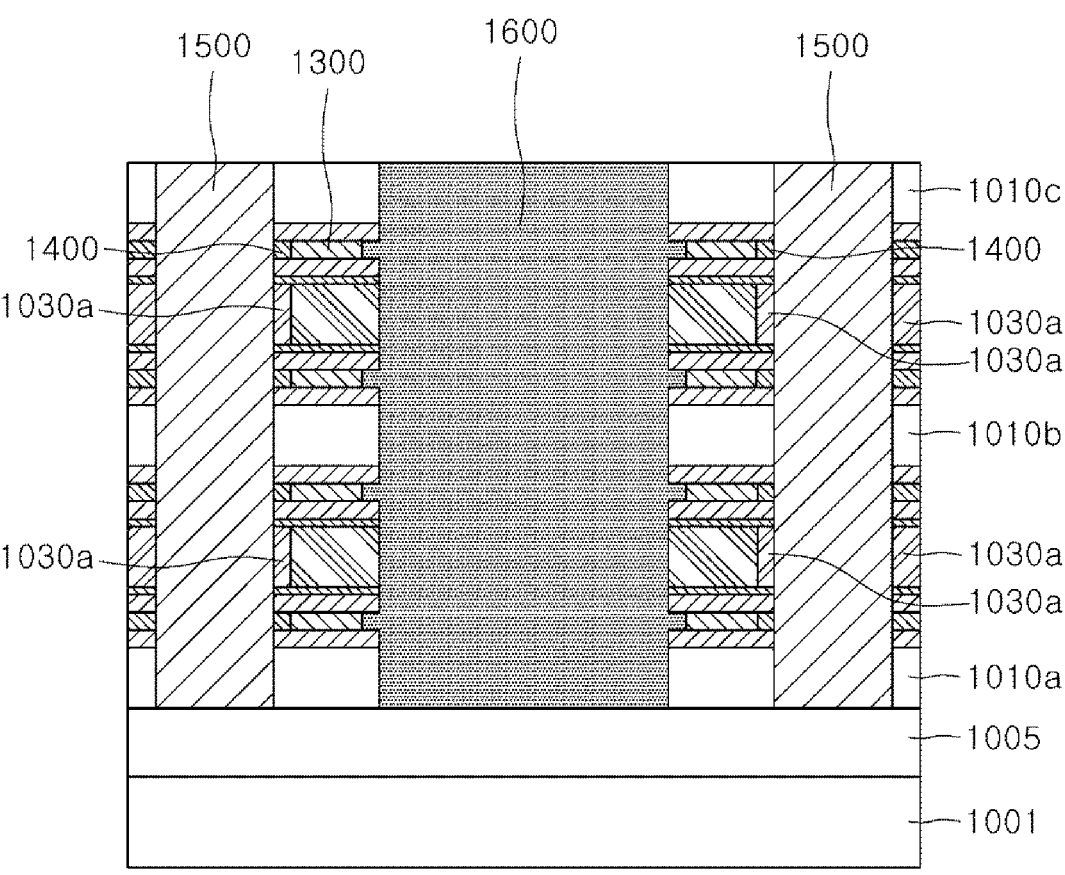
Figure 17:
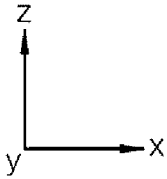
Figure 18:
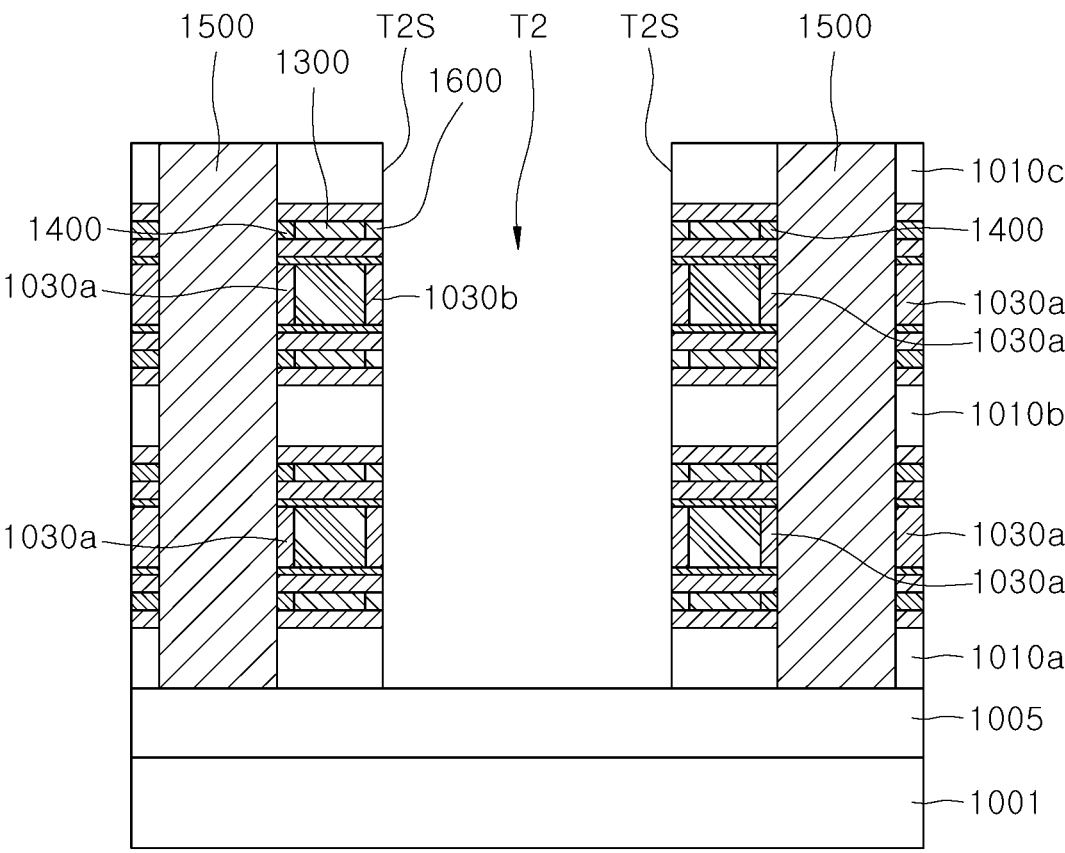
Figure 18:
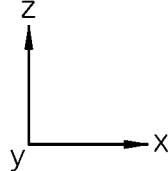

Referring to FIG. 17, the third recess spaces R3 and the second trench T2 illustrated in FIG. 16 may be filled with an insulating material 1600. Referring to FIG. 18, the insulating material 1600 inside the second trench T2 illustrated in FIG. 17 may be removed by applying an anisotropic etching method. Accordingly, the insulating material 1600 may remain in the third recess spaces (R3 of FIG. 16). In addition, second semiconductor doped regions 1030*b* may be formed by doping portions of the semiconductor layers 1030 exposed on the sidewall surface T2S of the second trench T2. As an example, the second semiconductor doped regions 1030*b* may be formed by implanting an n-type or p-type dopant using an ion implantation method.

Figure 19:
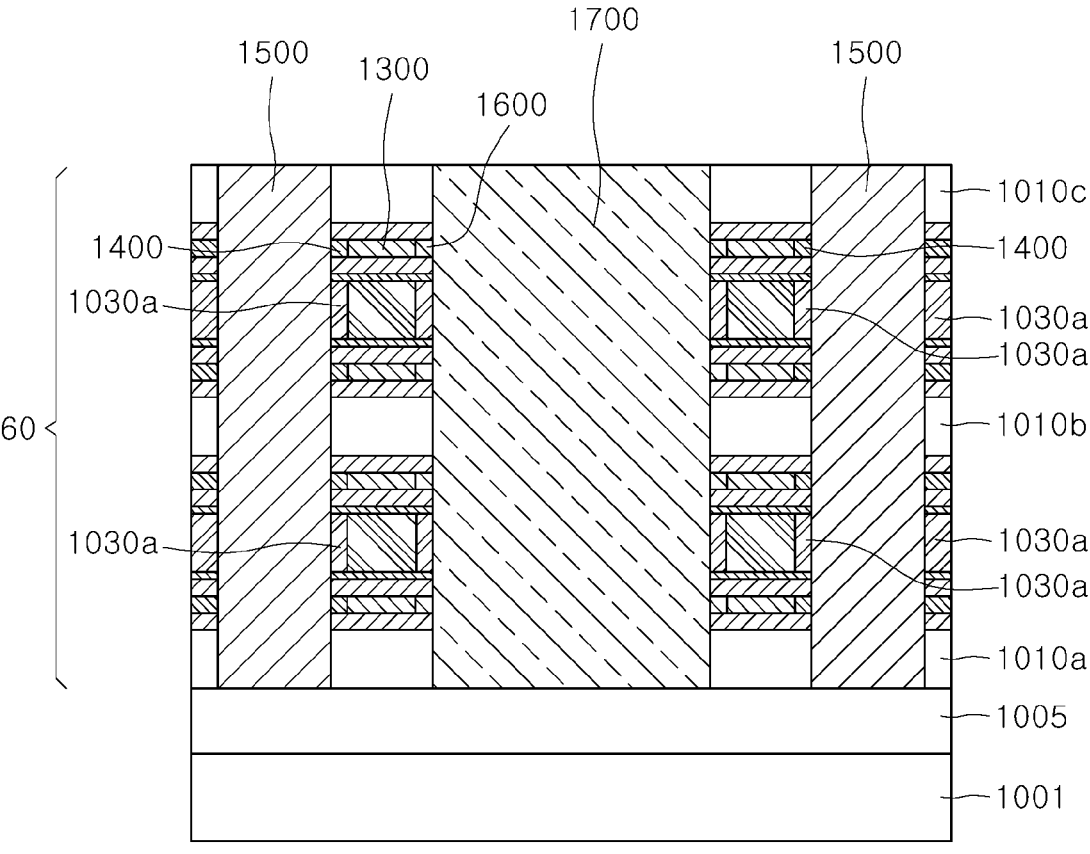
Figure 19:
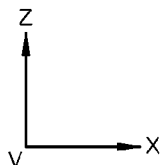
Figure 20:
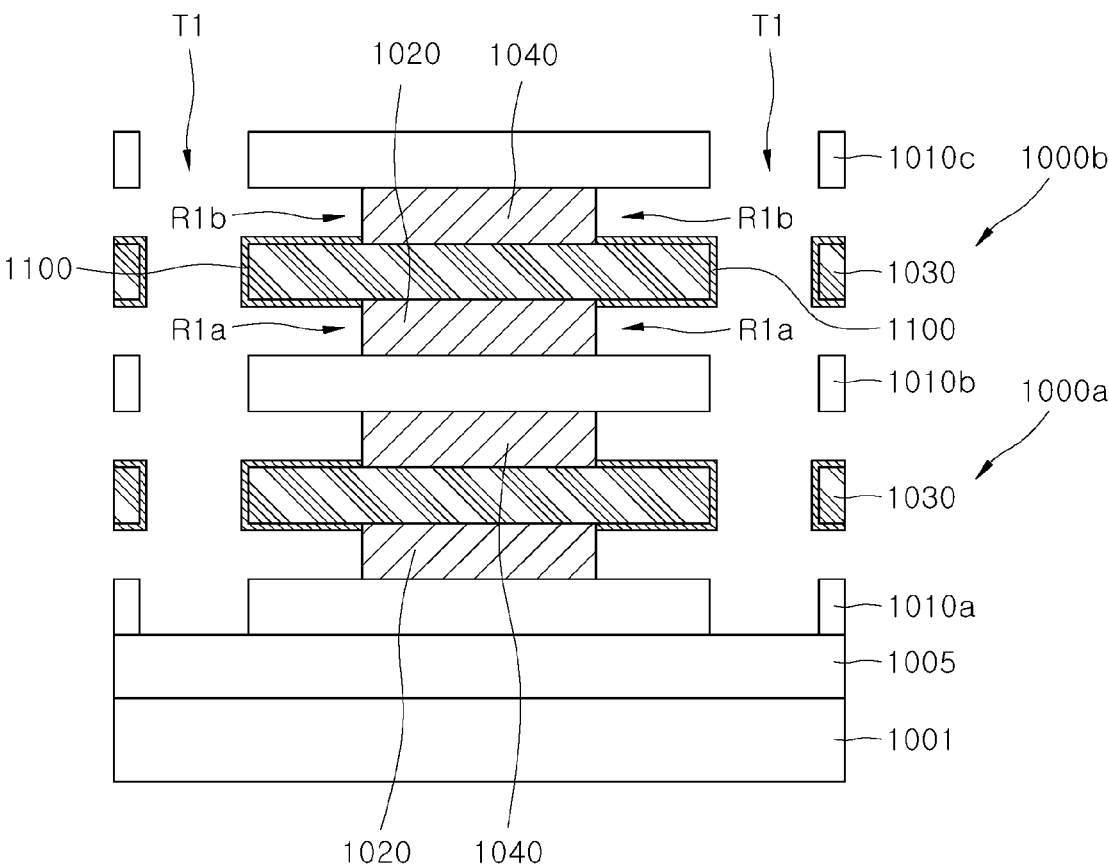
FIGS. 20 to 25 are schematic cross-sectional views illustrating a method of manufacturing a semiconductor device according to another embodiment of the present disclosure.
Figure 20:
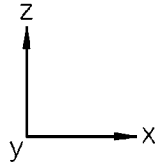

Referring to FIG. 19, the second trench T2 of FIG. 18 may be filled with a conductive material to form a source line structure 1700. The source line structure 1700 may be disposed to be spaced apart from the gate electrode layer 1300. For example, the source line structure 1700 and the gate electrode layer 1300 may be electrically insulated from each other by the insulating material 1600. As described above, the sixth stack structure 60 may be formed by performing the processes related to FIGS. 16 to 19. As a result, a semiconductor device according to an embodiment of the present disclosure may be manufactured.

FIGS. 20 to 25 are schematic cross-sectional views illustrating a method of manufacturing a semiconductor device according to another embodiment of the present disclosure. The methods described with reference to FIGS. 20 to 25 may be used in a method of manufacturing a semiconductor device 1*b* described with reference to FIGS. 3A and 3B.

First, the processes described above with reference to FIGS. 5 to 8 may be performed. As a result, a stack structure illustrated in FIG. 20 may be manufactured. The stack structure of FIG. 20 may be a structure in which an interfacial insulating material layer 1100 is formed on a semiconductor layer 1030 after first recess spaces R1*a* and R1*b* are formed in the second stack structure 20 illustrated in FIG. 7.

Figure 21:
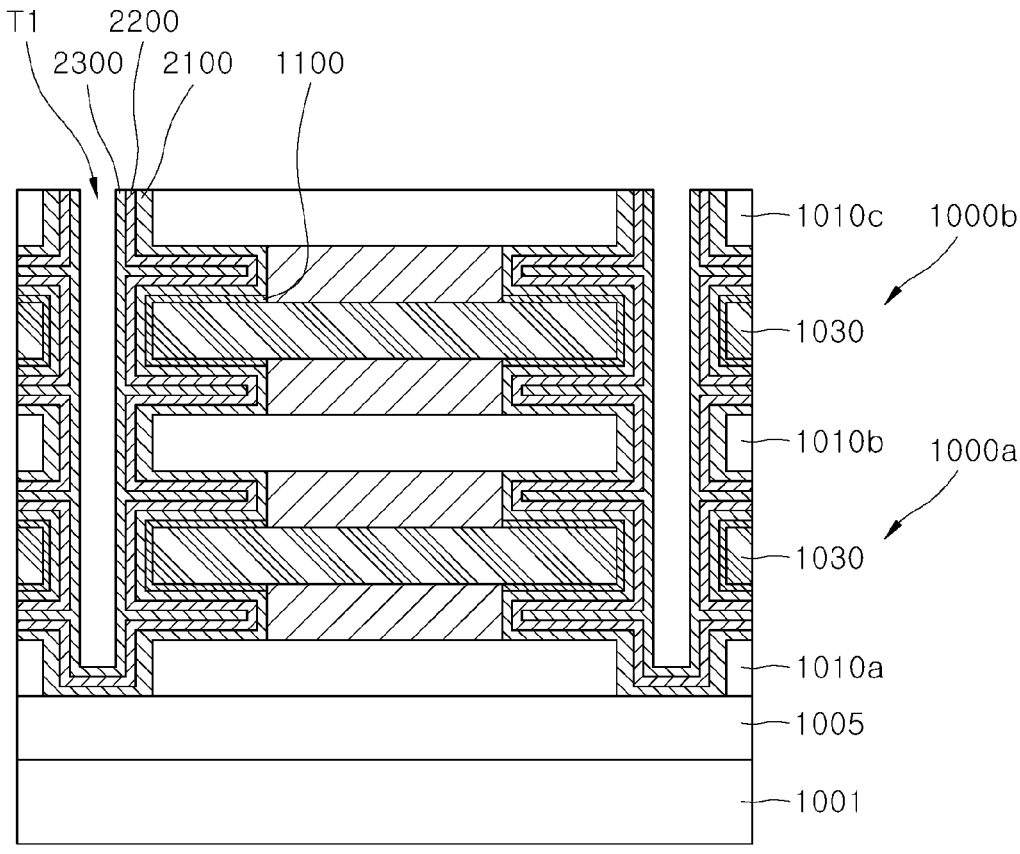
Figure 21:
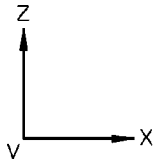

Referring to FIG. 21, a conductive material layer 2100 may be formed along the inner surfaces of the first trenches T1. Subsequently, a ferroelectric layer 2200 may be formed on the conductive material layer 2100. A gate electrode layer 2300 may be formed on the ferroelectric layer 2200.

The conductive material layer 2100 may be formed of or include, for example, metal, conductive metal nitride, or conductive metal oxide. The ferroelectric layer 2200 and the gate electrode layer 2300 may be substantially the same as the ferroelectric layer 1200 and the gate electrode layer 1300 of the methods described above with reference to FIGS. 5 to 19, respectively. The conductive material layer 2100, the ferroelectric layer 2200, and the gate electrode layer 2300 may be formed by applying, for example, a chemical vapor deposition method, a sputtering method, an atomic layer deposition method, or the like.

Figure 22:
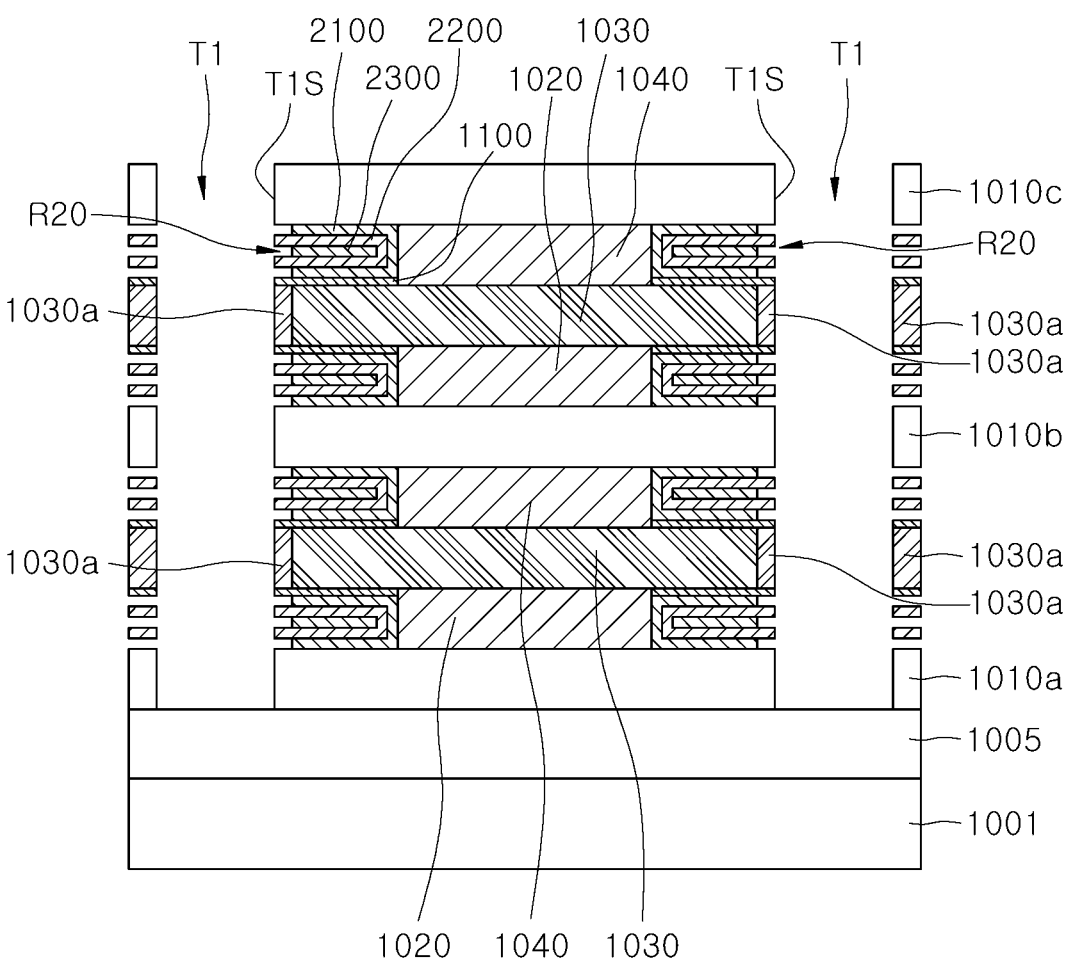
Figure 22:
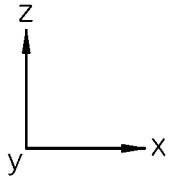

Referring to FIG. 22, substantially the same processes as the anisotropic etching method and the isotropic etching method described above with reference to FIGS. 10 and 11 may be performed with respect to the stack structure of FIG. 21. That is, the interfacial insulating layer 1100, the conductive material layer 2100, the ferroelectric layer 2200, and the gate electrode layer 2300 inside the first trenches T1 may be selectively removed by applying an anisotropic etching method. Subsequently, the conductive material layers 2100 and the gate electrode layers 2300 exposed on the sidewall surfaces T1S of the first trenches T1 may be selectively etched by applying an isotropic etching method to form recess spaces R20. In addition, portions of the semiconductor layers 1030 exposed on the sidewall surfaces T1S of the first trenches T1 may be doped to form first semiconductor doped regions 1030a.

Figure 23:
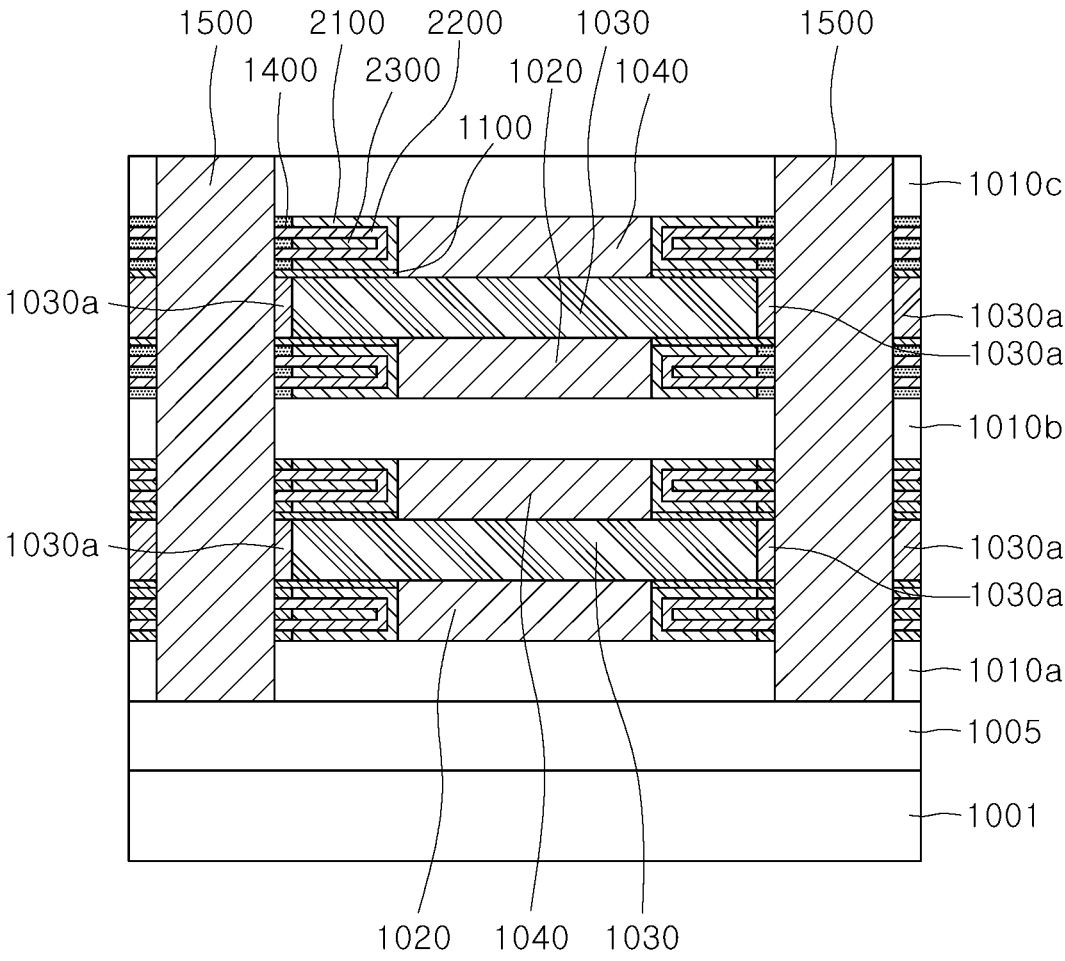
Figure 23:
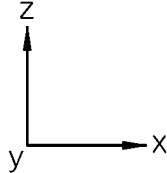

Referring to FIG. 23, by sequentially performing substantially the same processes as those described with reference to FIGS. 12 to 14, the recess spaces R20 may be filled with an insulating material 1400 and bit line structures 1500 may be formed inside the first trenches T1 of FIG. 22.

Figure 24:
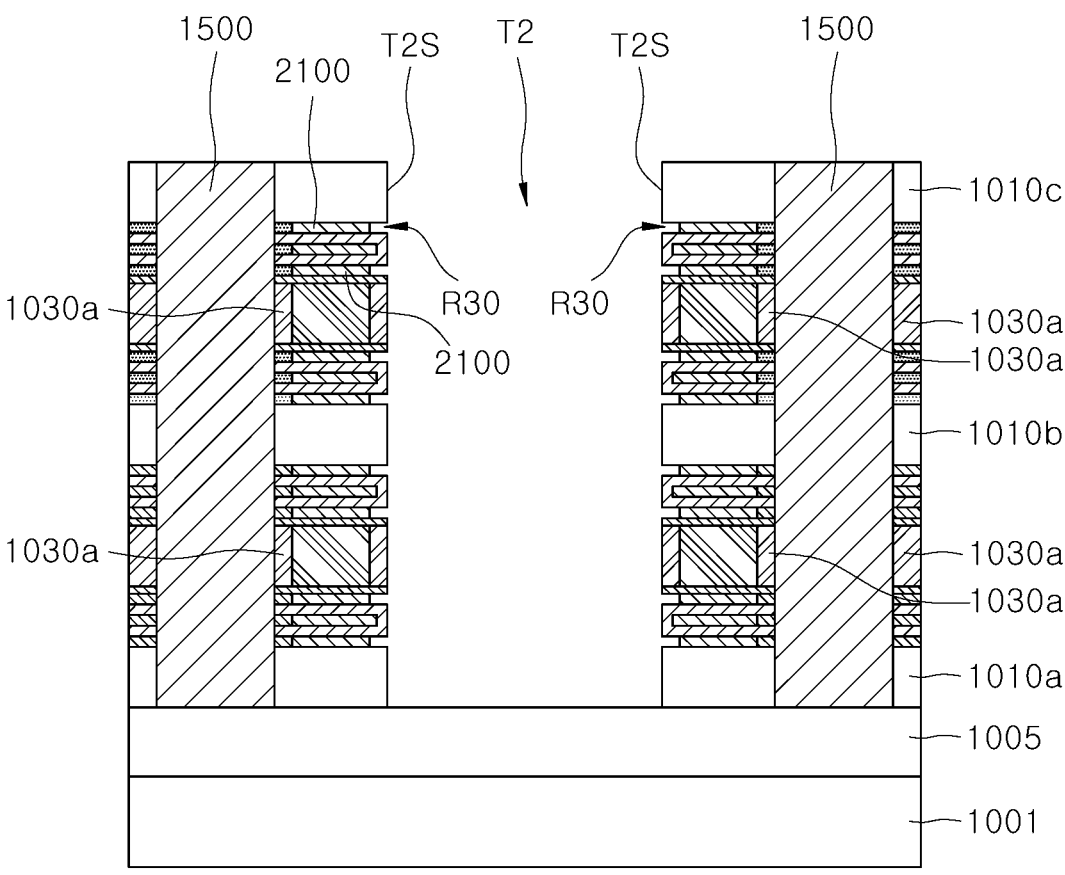
Figure 24:
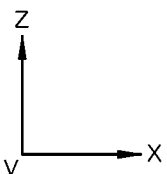

Referring to FIG. 24, substantially the same processes as the anisotropic etching method and the isotropic etching method described with reference to FIGS. 15 and 16 may be sequentially performed. That is, a second trench T2 exposing a base insulating layer 1005 may be formed by selectively etching the stack structure of FIG. 23 using an anisotropic etching method. Subsequently, recess spaces R30 may be formed by selectively etching the conductive material layers 2100 exposed on the sidewall surface T2S of the second trench T2 by applying an isotropic etching method.

Figure 25:
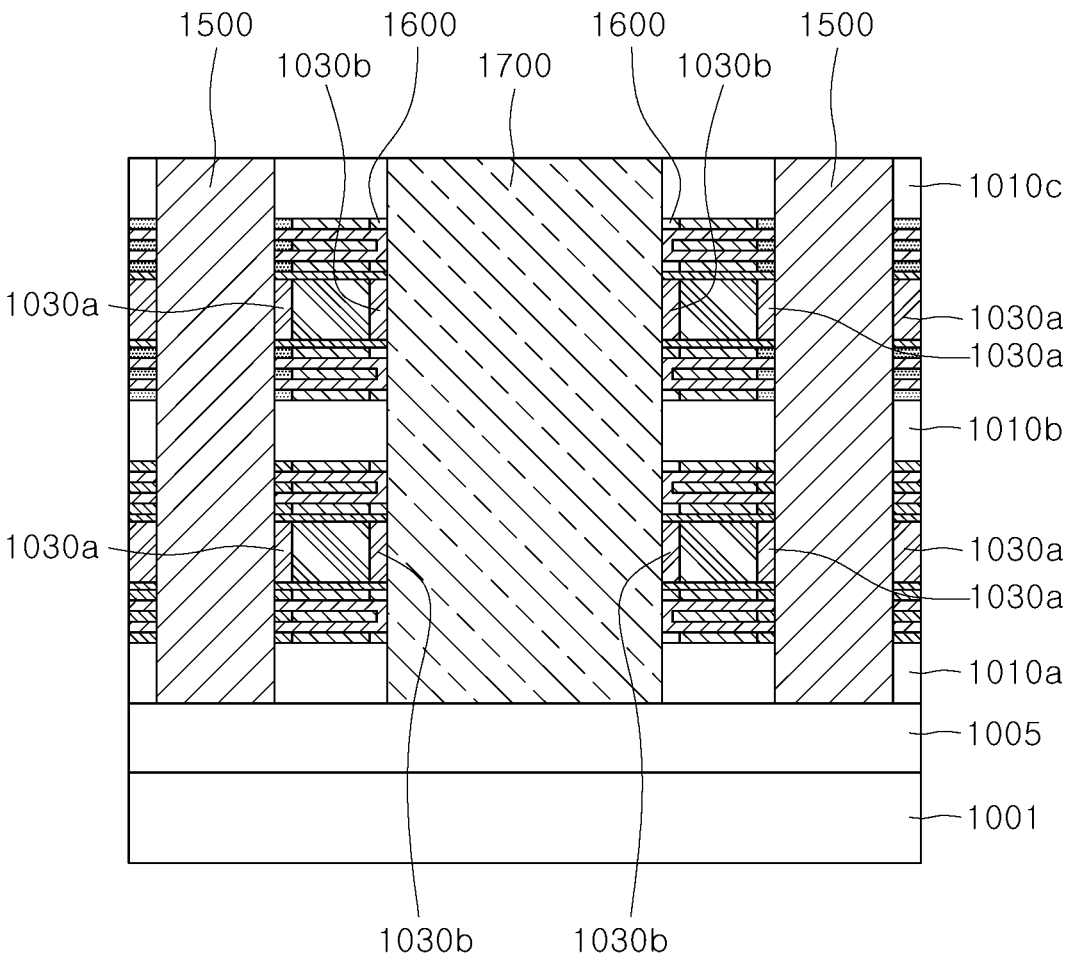
Figure 25:
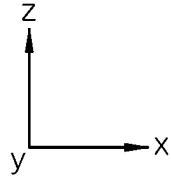

Referring to FIG. 25, substantially the same processes as those described with reference to FIGS. 17 to 19 may be sequentially performed. The recess spaces R30 and the second trench T2 of FIG. 24 may be filled with an insulating material 1600, after which the insulating material 1600 inside the second trench T2 may be removed by applying an anisotropic etching method. Subsequently, portions of the semiconductor layers 1030 exposed on the sidewall surfaces T2S of the second trench T2 may be doped to form second semiconductor doped regions 1030b. Subsequently, source line structures 1700 may be formed in the second trench T2. As a result, a semiconductor device according to an embodiment of the present disclosure may be manufactured.

FIGS. 26 to 30 are schematic cross-sectional views illustrating a method of manufacturing a semiconductor device according to yet another embodiment of the present disclosure. The methods described with reference to FIGS. 26 to 30 may be applied to a method of manufacturing the semiconductor device 1c described with reference to FIGS. 4A and 4B.

Figure 26:
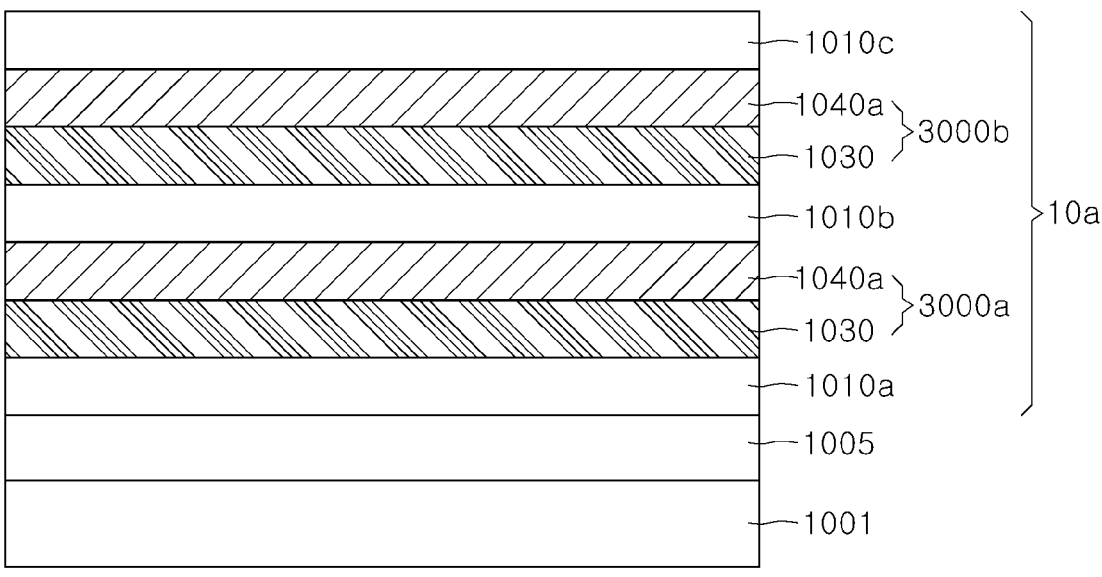
FIGS. 26 to 30 are schematic cross-sectional views illustrating a method of manufacturing a semiconductor device according to yet another embodiment of the present disclosure.
Figure 26:
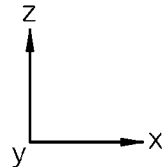

Referring to FIG. 26, a substrate 1001 may be provided. A base insulating layer 1005 may be formed on the substrate 1001. A first insulating layer 1010a may be formed on the base insulating layer 1005. A first sub-structure 3000a may be formed on the first insulating layer 1010a. The first sub-structure 3000a may include a semiconductor layer 1030 formed on the first insulating layer 1010a and a sacrificial layer 1040a formed on the semiconductor layer 1030. In the first sub-structure 3000a of FIG. 26, a sacrificial layer is not disposed between the first insulating layer 1010a and the semiconductor layer 1030, as compared to the first sub-structure 1000a of FIG. 5.

Subsequently, a second insulating layer 1010b may be formed on the first sub-structure 3000a. A second sub-structure 3000b may be formed on the second insulating layer 1010b. The configuration of the second sub-structure 3000b may be substantially the same as that of the first sub-structure 3000a. A third insulating layer 1010c may be formed on the second sub-structure 3000b. As a result, a first stack structure 10a may be formed on the base insulating layer 1005.

Figure 27:
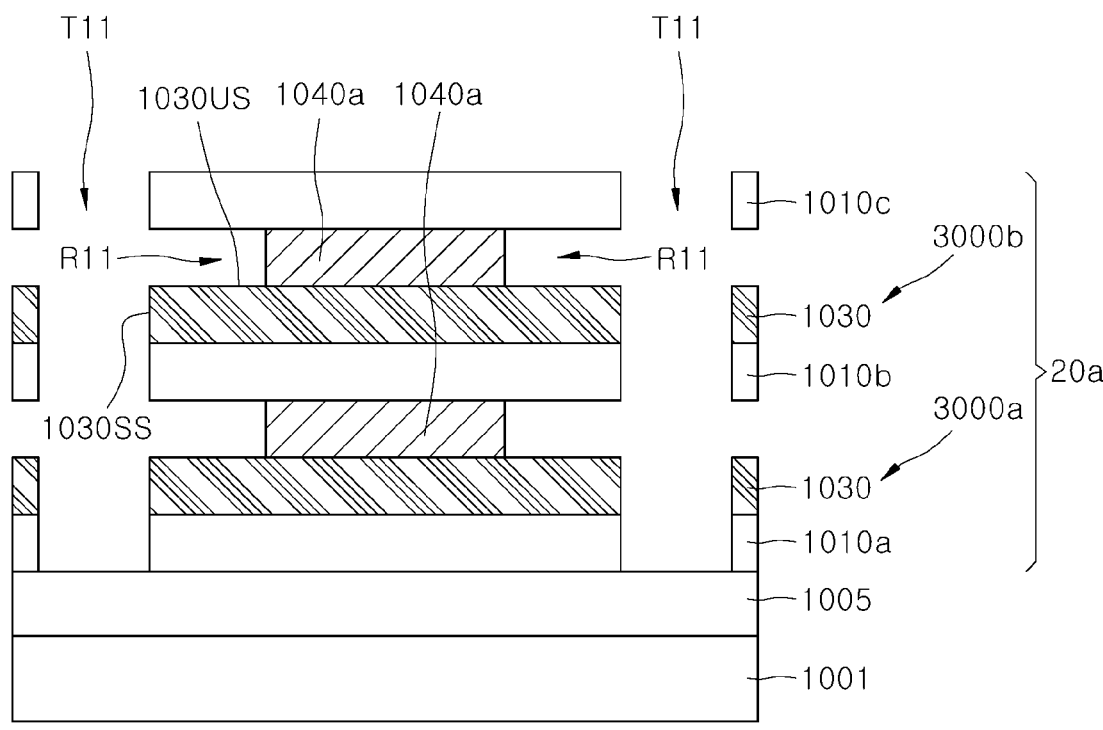
Figure 27:
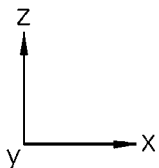

Referring to FIG. 27, substantially the same processes as those described above with reference to FIGS. 6 and 7 may be sequentially performed with respect to the first stack structure 10a. That is, trenches T11 exposing the base insulating layer 1005 may be formed by selectively etching the first stack structure 10a on the base insulating layer 1005. Subsequently, the sacrificial layer 1040a exposed on the sidewall surfaces of the trenches T11 may be selectively etched to form recess spaces R11. Accordingly, a second stack structure 20a may be formed.

Because the sacrificial layer 1040a is formed only on a surface of the semiconductor layer 1030 in each of the first and second sub-structures 3000a and 3000b of the first stack structure 10a of FIG. 26, portions of upper surfaces 1030US and side surfaces 1030SS of the semiconductor layer 1030 may be exposed after formation of the recess spaces R11, as illustrated in FIG. 27.

Figure 28:
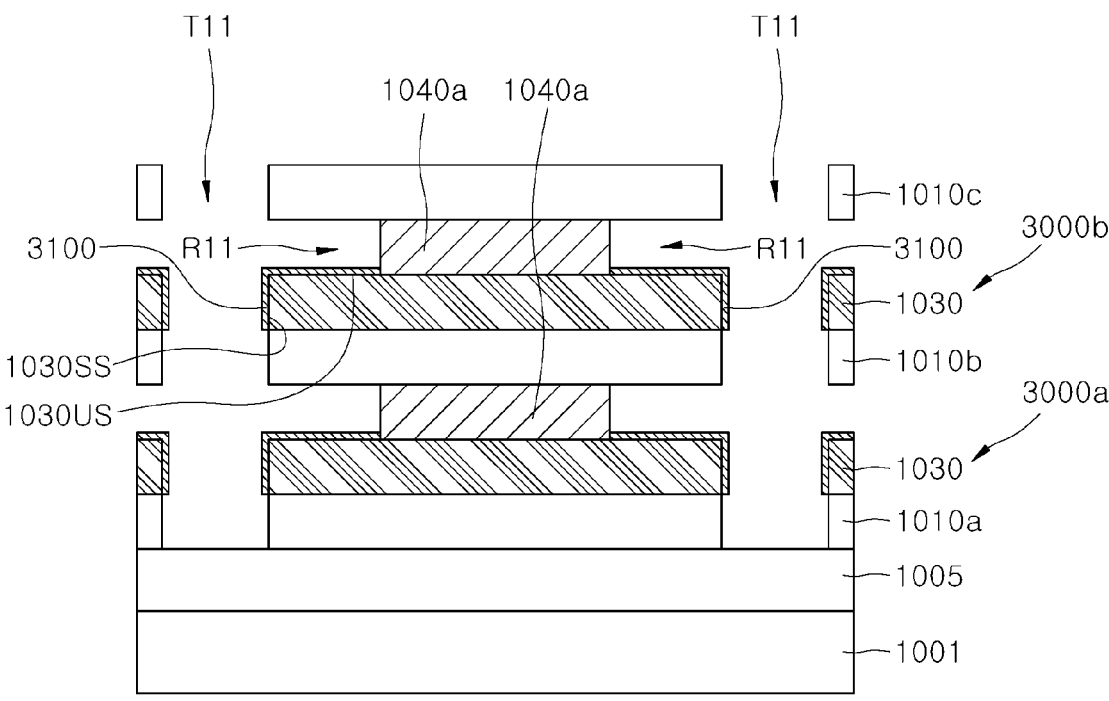
Figure 28:
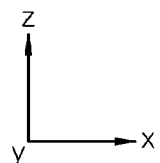

Referring to FIG. 28, an interfacial insulating layer 3100 may be formed on the portions of the upper surfaces 1030US and the side surfaces 1030SS of the semiconductor layer 1030. The interfacial insulating layer 3100 may be formed of substantially the same material as the interfacial insulating layer 1100 of FIG. 8.

Figure 29:
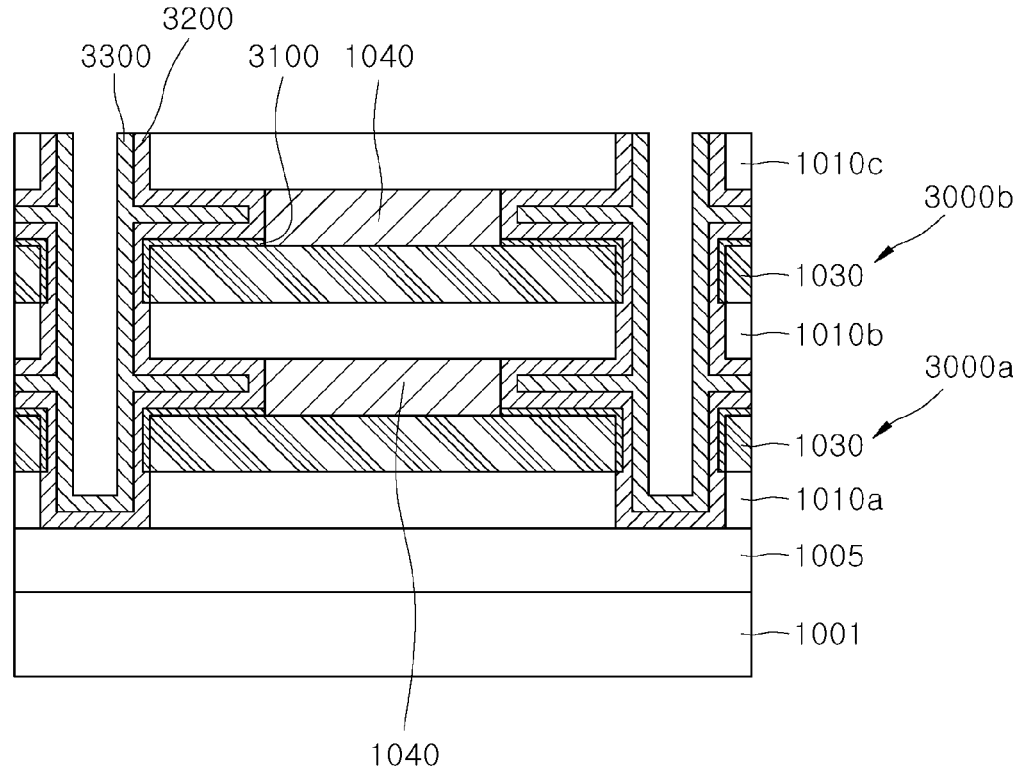
Figure 29:
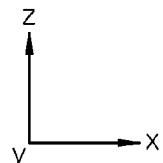

Referring to FIG. 29, substantially the same process as that described above with reference to FIG. 9 may be performed. That is, a ferroelectric layer 3200 may be formed along the inner surfaces of the trenches T11 of FIG. 28. A gate electrode layer 3300 may be formed on the ferroelectric layer 3200. The ferroelectric layer 3200 and the gate electrode layer 3300 may be made of substantially the same materials as the ferroelectric layer 1200 and the gate electrode layer 1300 of FIG. 9, respectively.

Figure 30:
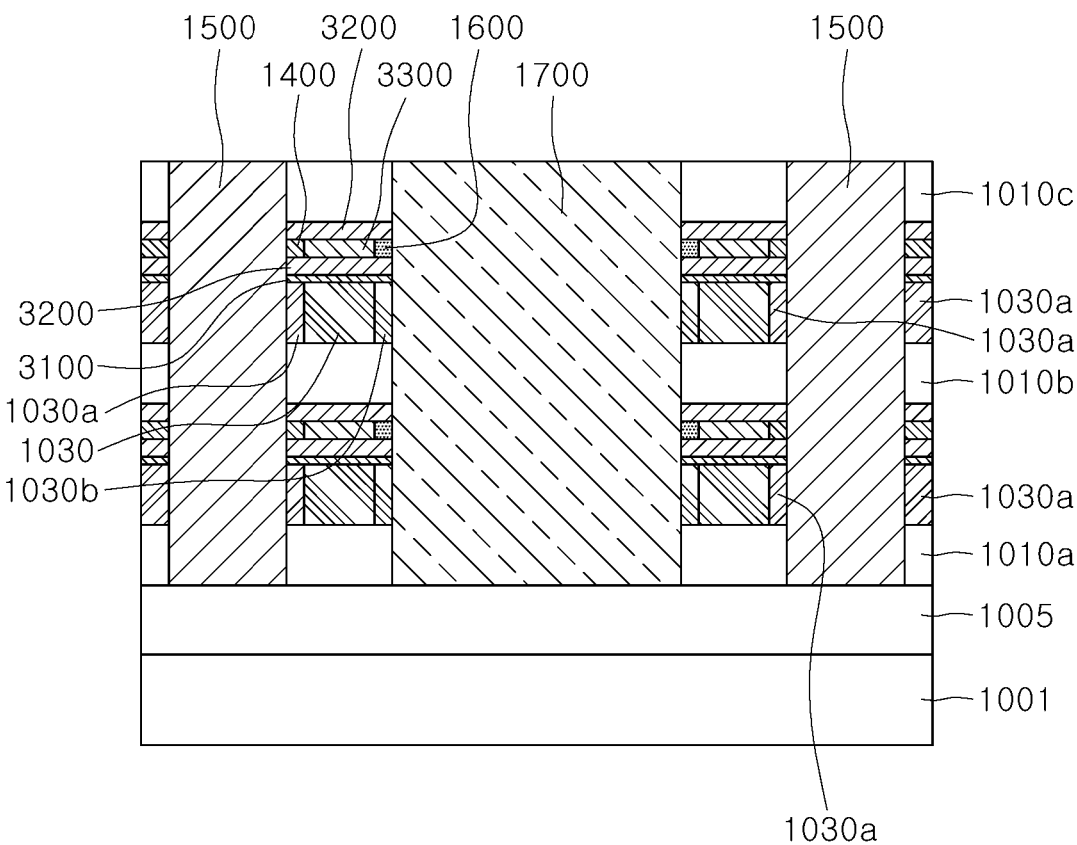
Figure 30:
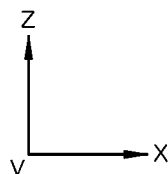

Subsequently, substantially the same processes as those described above with reference to FIGS. 10 to 19 may be sequentially performed. As a result, as illustrated in FIG. 30, a semiconductor device according to an embodiment of the present disclosure may be manufactured.

Figure 31A:
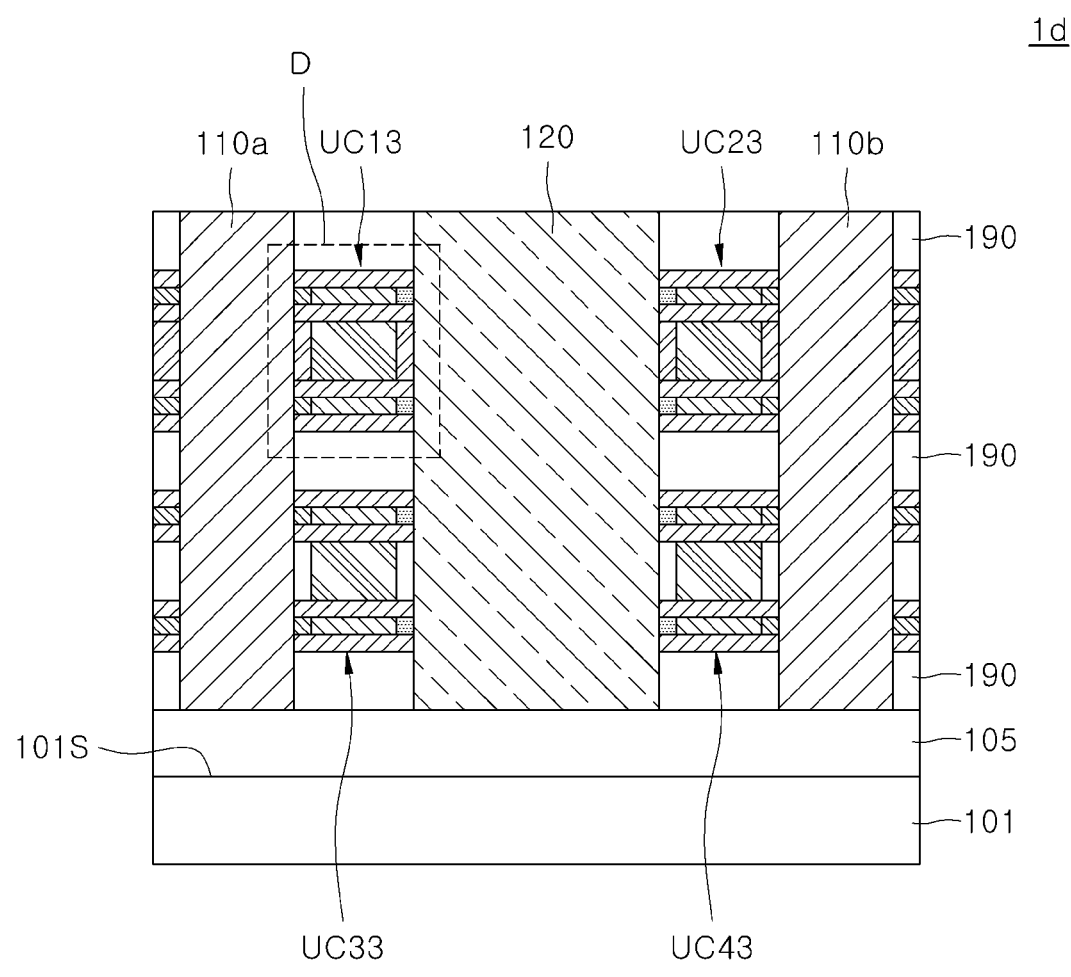
FIG. 31A is a schematic cross-sectional view of a semiconductor device according to still yet another embodiment of the present disclosure.
Figure 31A:
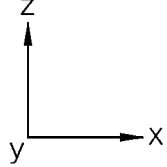
Figure 31B:
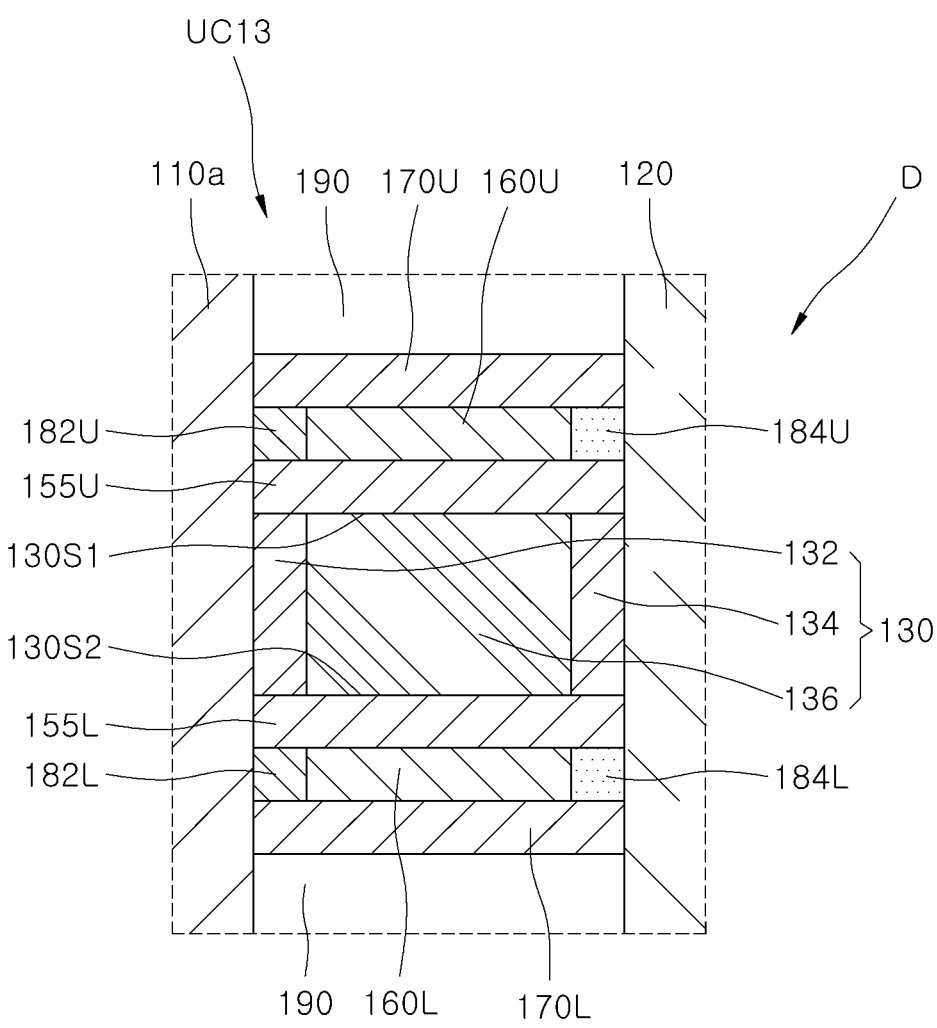
FIG. 31B is an enlarged view of portion 'D' of a semiconductor device of FIG. 31A.
Figure 32:
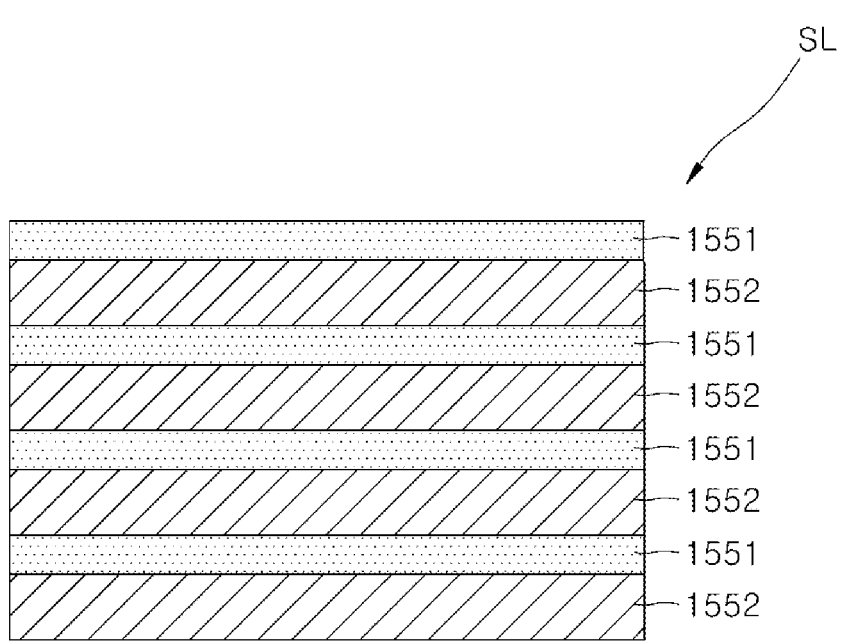
FIG. 32 is a schematic cross-sectional view illustrating a ferroelectric layer of a semiconductor device according to an embodiment of the present disclosure.
Figure 33A:
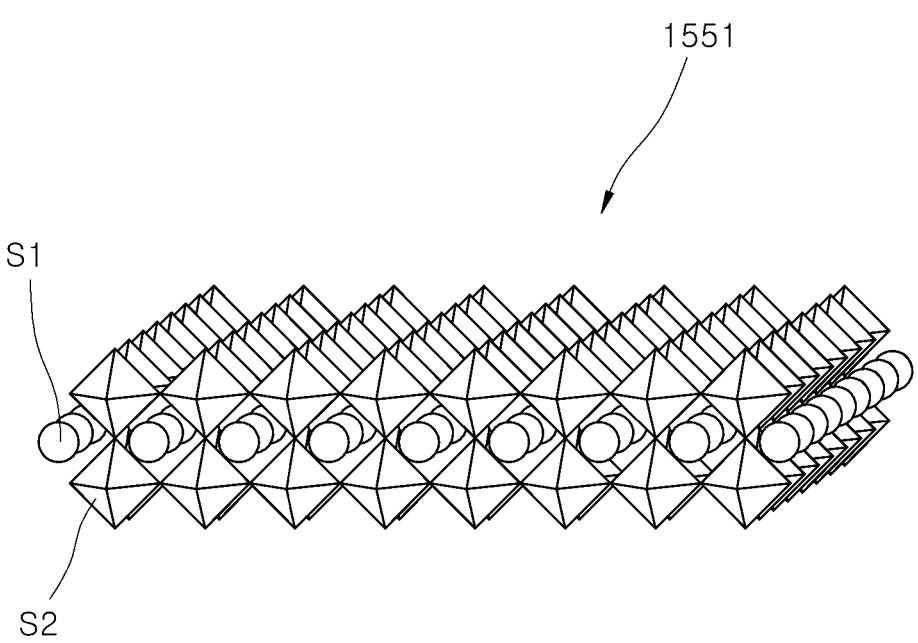
FIGS. 33A and 33B are schematic views of nanosheets constituting the ferroelectric layer of FIG. 32.
Figure 33B:
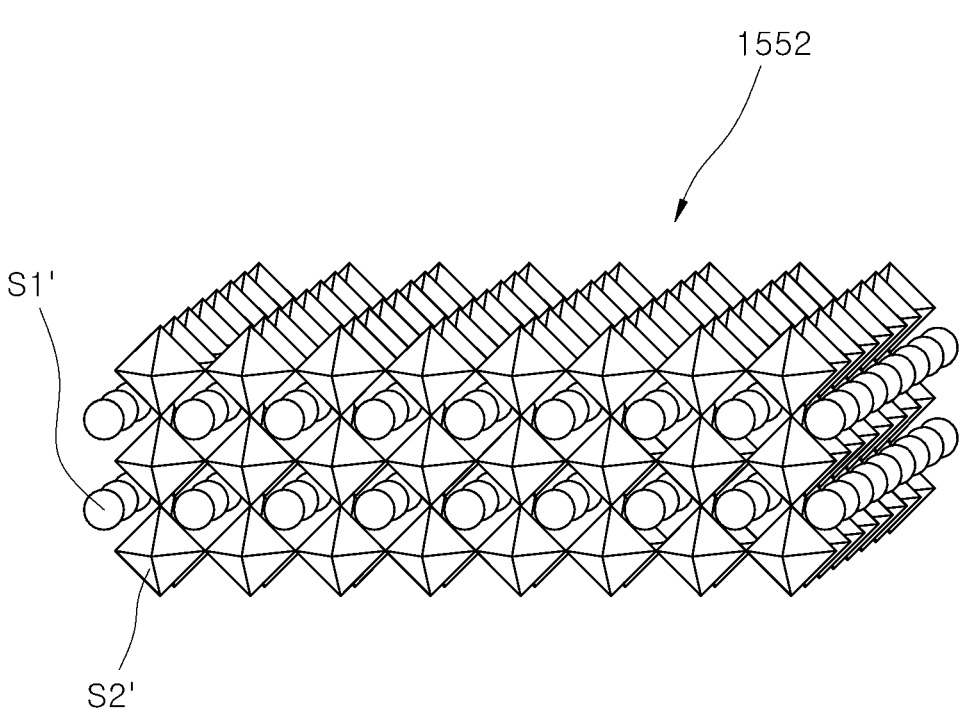

FIG. 31A is a schematic cross-sectional view of a semiconductor device 1d according to still yet another embodiment of the present disclosure. FIG. 31B is an enlarged view of portion 'D' of the semiconductor device 1d of FIG. 31A. FIG. 32 is a schematic cross-sectional view illustrating a ferroelectric layer of the semiconductor device 1d according to an embodiment of the present disclosure. FIGS. 33A and 33B are schematic views of nanosheets constituting the ferroelectric layer of FIG. 32.

Referring to FIGS. 31A and 31B, the semiconductor device 1d might not include the first and second interfacial insulating layers (140U and 140L of FIG. 2B), compared to the semiconductor device 1a described above with reference to FIGS. 2A and 2B. In addition, each of first and second ferroelectric layers 155U and 155L of the semiconductor device 1d may include a ferroelectric superlattice structure. Hereinafter, the configuration of the semiconductor device 1d differentiated from the semiconductor device 1a of FIGS. 2A and 2B will be mainly described in order to avoid redundant description. Components not described may be substantially the same as those of the semiconductor device 1a of FIGS. 2A and 2B.

Referring to FIG. 31A, first to fourth unit cell structures UC13, UC23, UC33, and UC43 of the semiconductor device 1d may correspond to the first to fourth unit cells MC1, MC2, MC3, and MC4, in the circuit diagram of FIG. 1, respectively. The configurations of the first to fourth unit cell structures US13, UC23, UC33, and UC43 may be substantially the same as each other. Hereinafter, the first unit cell structure UC13 among the first to fourth unit cell structures UC13, UC23, UC33, and UC43 will be described in more detail with reference to FIG. 31B.

Referring to FIGS. 31A and 31B together, the first ferroelectric layer 155U may be disposed on a first surface 130S1 of a semiconductor layer 130. The first ferroelectric layer 155U may contact the semiconductor layer 130. That is, the first ferroelectric layer 155U and the semiconductor layer 130 may form a direct interface. In addition, the second ferroelectric layer 155L may be disposed on a second surface 130S2 of the semiconductor layer 130. The second ferroelectric layer 155L may contact the semiconductor layer 130. That is, the second ferroelectric layer 155L and the semiconductor layer 130 may form a direct interface.

In an embodiment, the first ferroelectric layer 155U may include a ferroelectric superlattice structure (SL of FIG. 32). As an example, the ferroelectric superlattice structure (SL of FIG. 32) may include a plurality of two-dimensional nanosheets. Here, the two-dimensional nanosheet may refer to a two-dimensional single crystal material in the form of a sheet having a nano-sized thickness. As an example, the two-dimensional nanosheet may have a thickness of 0.5 nm to 3 nm. The configuration of the second ferroelectric layer 155L may be substantially the same as that of the first ferroelectric layer 155U.

Referring to FIG. 32, the ferroelectric superlattice structure SL of each of the first and second ferroelectric layers 155U and 155L may include first and second metal oxide nanosheets 1551 and 1552 that are alternately stacked. The first metal oxide nanosheet 1551 and the second metal oxide nanosheet 1552 may include different materials. FIG. 32 shows four first metal oxide nanosheets 1551 and four second metal oxide nanosheets 1552, but the present disclosure is not necessarily limited thereto, and various numbers of first and second metal oxide nanosheets 1551 and 1552 may be applied.

In an embodiment, each of the first and second metal oxide nanosheets 1551 and 1552 might not have ferroelectricity. As an example, each of the first and second metal oxide nanosheets 1551 and 1552 may have paraelectricity. Meanwhile, when the first and second metal oxide nanosheets 1551 and 1552 are alternately stacked to form the superlattice structure SL, the superlattice structure SL may have ferroelectricity.

According to one of various theories explaining the ferroelectric superlattice structure SL, each of the first and second metal oxide nanosheets 1551 and 1552 may have a structure of inversion symmetry to have a paraelectricity. However, when the plurality of first and second metal oxide nanosheets 1551 and 1552 are alternately stacked to form the superlattice structure SL as illustrated in FIG. 32, as the inversion symmetry is broken at the interfaces between the first and second metal oxide nanosheets 1551 and 1552, the superlattice structure SL may have ferroelectricity exhibiting spontaneous polarization as a whole.

Examples of the first and second metal oxide nanosheets 1551 and 1552 are illustrated in FIGS. 33A and 33B, respectively. Referring to FIGS. 33A and 33B, the first metal oxide nanosheet 1551 may include a two-dimensional single crystal material having the chemical formula of $AB_2O_7$. Here, element A may be lanthanum (La) or europium (Eu), element B may be niobium (Nb) or tantalum (Ta), and element O may be oxygen. In the first metal oxide nanosheet 1551 of FIG. 33A, the element A may be located at the site S1 and the element B may be located at the site S2. Oxygen is omitted from FIG. 33A. Referring to FIG. 33B, the second metal oxide nanosheet 1552 may include a two-dimensional single crystal material having the chemical formula of $C_2B_3O_{10}$. Here, element C may be calcium (Ca) or strontium (Sr), element B may be niobium (Nb) or tantalum (Ta), and element O may be oxygen. In the second metal oxide nanosheet 1552 of FIG. 33B, the element C may be located at the site S1' and the element B may be located at the site S2'. Oxygen is omitted from FIG. 33B. As an example, in the ferroelectric superlattice structure SL, the first metal oxide nanosheet 1551 may be a nanosheet formed of $LaNb_2O_7$, and the second metal oxide nanosheet 1552 may be a nanosheet formed of $Ca_2Nb_3O_{10}$.

In another embodiment not illustrated, each of the first and second metal oxide nanosheets 1551 and 1552 may include titanium oxide, calcium niobium oxide, manganese oxide, niobium oxide, tantalum oxide, or titanium niobium oxide. Here, the first and second metal oxide nanosheets 1551 and 1552 may be made of different materials. As an example, the first metal oxide nanosheet 1551 may be a nanosheet formed of $Ti_{0.87}O_2$, and the second metal oxide nanosheet may be a nanosheet formed of $Ca_2Nb_3O_{10}$.

In another embodiment not illustrated, each of the first and second metal oxide nanosheets 1551 and 1552 may include a perovskite material. As an example, the perovskite material may include $Ca_2Nb_3O_{10}$, $Ca_2NaNb_4O_{13}$, $Ca_2Na_2Nb_5O_{16}$, or $Ca_2Na_3Nb_6O_{19}$. In this case, the first and second metal oxide nanosheets 1551 and 1552 may be made of different materials. As an example, the first metal oxide nanosheet 1551 may be a nanosheet formed of $Ca_2Nb_3O_{10}$, and the second metal oxide nanosheet 1552 may be a nanosheet formed of $Ca_2NaNb_4O_{13}$.

Referring back to FIGS. 31A and 31B, the first and second ferroelectric layers 155U and 155L may be disposed directly on the first and second surfaces 130S1 and 130S2 of the semiconductor layer 130, respectively. In an embodiment, the first and second ferroelectric layers 155U and 155L may form direct interfaces with the semiconductor layer 130. Accordingly, the semiconductor device 1d according to the embodiment of the present disclosure might not include the first and second interfacial insulating layers 140U and 140L of the semiconductor device 1a of FIGS. 2A and 2B.

Referring to FIGS. 31A and 31B, a first gate electrode layer 160U, a first bit line insulating layer 182U, and a first source line insulating layer 184U may be disposed on the first ferroelectric layer 155U. A second gate electrode layer 160L, a second bit line insulating layer 182L, and a second source line insulating layer 184L may be disposed on the second ferroelectric layer 155L.

As described above, in the semiconductor device according to an embodiment of the present disclosure, each of first and second ferroelectric layers may include a ferroelectric superlattice structure. The ferroelectric superlattice structure may include first and second metal oxide nanosheets that are alternately stacked. The first and second metal oxide nanosheets may be made of different materials.

Meanwhile, the ferroelectric layer including the ferroelectric superlattice structure may be applied to the semiconductor device 1c described above with reference to FIGS. 4A and 4B.

Figure 34:
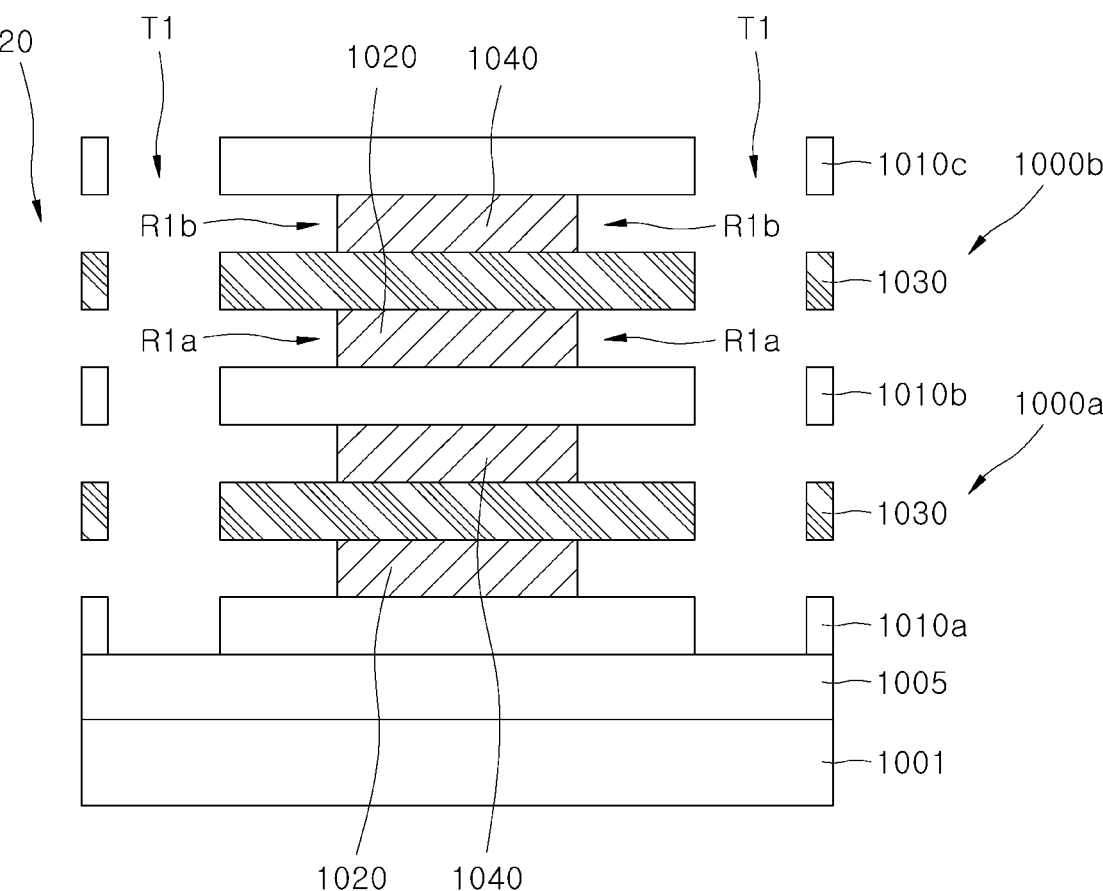
FIGS. 34 and 35 are schematic views illustrating a method of manufacturing a semiconductor device according to an embodiment of the present disclosure.
Figure 34:
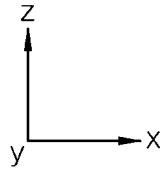
Figure 35:
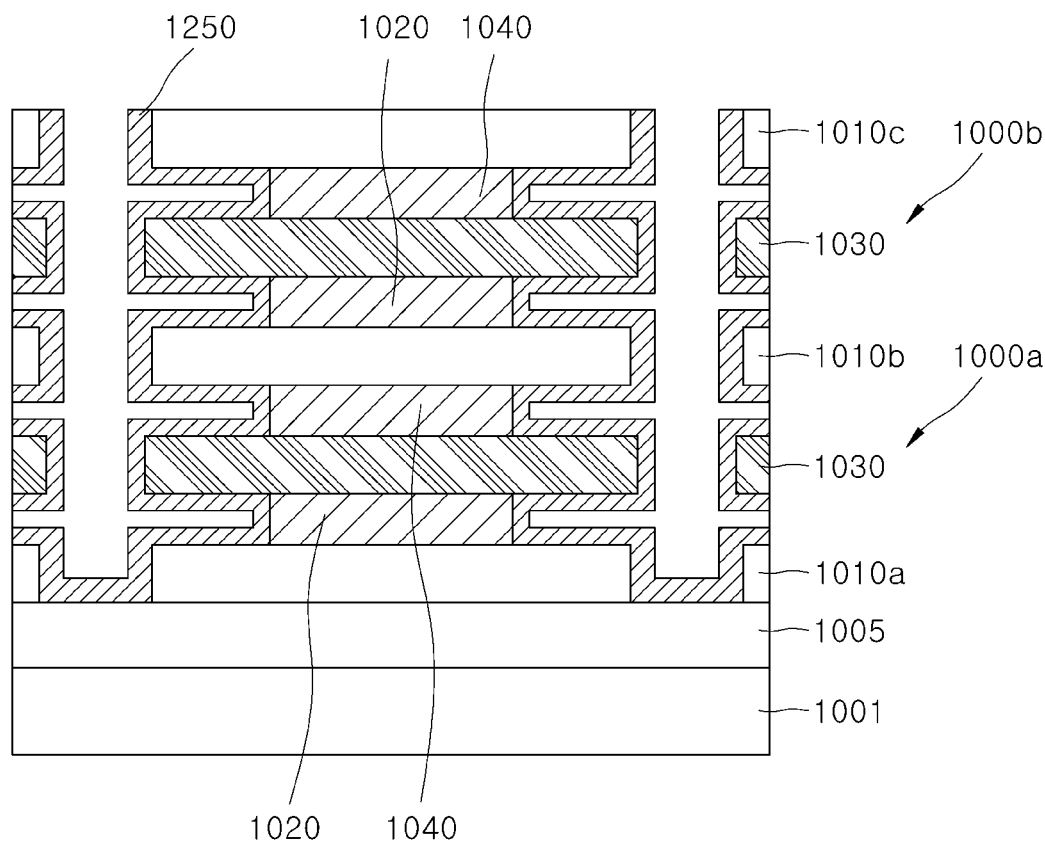
Figure 35:
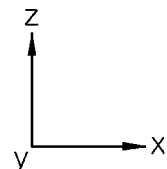

FIGS. 34 and 35 are schematic views illustrating a method of manufacturing a semiconductor device according to an embodiment of the present disclosure. The method of manufacturing the semiconductor device to be described with reference to FIGS. 34 and 35 may be applied to a method of manufacturing the semiconductor device 1d described with reference to FIGS. 31A and 31B.

First, the processes described above with reference to FIGS. 5 to 7 may be performed. As a result, a stack structure illustrated in FIG. 34 may be manufactured. Referring to FIG. 34, the first stack structure 10 of FIG. 5 may be selectively etched to form first trenches T1 exposing a base insulating layer 1005, and first and second sacrificial layers 1020 and 1040 may be selectively etched in the first trenches T1 to form a second stack structure 20 including first recess spaces R1a and R1b. The first recess spaces R1a and R1b may include a first side space R1a formed by etching the first sacrificial layer 1020 and a second side space R1b formed by etching the second sacrificial layer 1040.

Referring to FIG. 35, a ferroelectric layer 1250 may be formed along inner wall surfaces of the first trenches (T1 of FIG. 34). The ferroelectric layer 1250 may include a ferroelectric superlattice structure. As described with reference to FIG. 32, the ferroelectric layer 1250 may be formed by alternately stacking different first and second metal oxide nanosheets 1551 and 1552.

In an embodiment, each of the first and second metal oxide nanosheets 1551 and 1552 may be secured from a metal oxide precursor by a chemical exfoliation method. According to the chemical exfoliation method, a metal oxide precursor having a layered structure may be prepared. The metal oxide precursor may include a plurality of host layers each composed of metal and oxygen and alkali cations positioned between the plurality of host layers. A plurality of metal oxide nanosheets may be secured from the plurality of host layers by separating the alkali cations through a chemical method. As an example, each of the plurality of metal oxide nanosheets may have a thickness of 0.5 nm to 3 nm.

Referring to FIGS. 32, 34, and 35 together, the ferroelectric layer 1250 may be formed by repeating the process of alternately stacking the first and second metal oxide nanosheets 1551 and 1552 on the structure in which the second stack structure 20 having the first recess spaces R1a and R1b is formed. In an embodiment, as a method of stacking the first and second metal oxide nanosheets 1551 and 1552, as an example, the Langmuir-Blodgett method or the layer-by-layer method may be applied.

According to the Langmuir-Blodgett method, an aqueous solution in which predetermined metal oxide nanosheets are dispersed may be prepared. After the substrate is immersed in the aqueous solution, the substrate may be lifted out of the aqueous solution. When the substrate is lifted out of the aqueous solution, due to the surface tension of the aqueous solution on the substrate, the metal oxide nanosheets in the aqueous solution may be attached to the substrate in the form of a monolayer. Accordingly, the first and second metal oxide nanosheets 1551 and 1552 may be alternately stacked on the second stack structure 20 by continuously applying the Langmuir-Blodgett method.

According to the layer-by-layer method, a first solution in which predetermined metal oxide nanosheets are dispersed and a second solution containing a polymer having a surface charge opposite to that of the predetermined metal oxide nanosheet may be prepared. First, the polymer may be coated on the substrate by immersing the substrate in the second solution containing the polymer. Subsequently, the substrate coated with the polymer may be immersed in the first solution in which the metal oxide nanosheets are dispersed. Accordingly, due to the electrostatic attraction between the polymer and the metal oxide nanosheet, the metal oxide nanosheet may be formed on the substrate in the form of a monolayer. Accordingly, the first and second metal oxide nanosheets 1551 and 1552 may be alternately stacked on the second stack structure 20 by continuously applying the layer-by-layer method.

Through the method, the ferroelectric layer 1250 may be formed as the ferroelectric superlattice structure including the plurality of first and second metal nanosheets 1551 and 1552. As described above, because the ferroelectric layer 1250 is formed through the solution process such as the Langmuir-Blodgett method or the layer-by-layer method, the interfacial insulating layer might not be formed between the ferroelectric layer 1250 and the semiconductor layer 1030. When the ferroelectric layer 1250 is formed on the semiconductor layer 1030 by a conventional thermal deposition process, an unwanted insulating material layer may be formed between the ferroelectric layer 1250 and the semiconductor layer 1030. When a gate voltage is applied between the semiconductor layer 1030 and a gate electrode layer 1300, the insulating material layer is dielectrically destroyed before the ferroelectric layer 1250, and thus, endurance of the semiconductor device may be deteriorated. Conversely, according to the embodiment of the present disclosure, the ferroelectric layer 1250 may directly contact the semiconductor layer 1030 while excluding the interfacial insulating layer, thereby improving endurance of the semiconductor device.

Subsequently, as described above with reference to FIG. 9, the gate electrode layer 1300 may be formed on the ferroelectric layer 1250. Subsequently, the processes described above with reference to FIGS. 10 to 19 may be performed to manufacture the semiconductor device 1d described above with reference to FIGS. 31A and 31B.

The above-described method of forming the ferroelectric layer 1250 may be applied to the formation of the ferroelectric layer of the semiconductor device described above with reference to FIGS. 20 to 25 and the formation of the ferroelectric layer of the semiconductor device described with reference to FIGS. 26 to 30.

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor device comprising:
a substrate;
a bit line structure and a source line structure each extending in a direction perpendicular to a surface of the substrate;
a semiconductor layer disposed over the substrate between the bit line structure and the source line structure on a plane parallel to the surface of the substrate;
a ferroelectric layer disposed on the semiconductor layer and including a ferroelectric superlattice structure; and
a gate electrode layer disposed on the ferroelectric layer,-
wherein the semiconductor layer, the ferroelectric layer and the gate electrode layer are stacked along the direction perpendicular to the surface of the substrate.

2. The semiconductor device of claim 1, wherein the ferroelectric superlattice structure includes a plurality of two-dimensional nanosheets.

3. The semiconductor device of claim 1, wherein the ferroelectric superlattice structure includes alternately stacked first and second metal oxide nanosheets, the first metal oxide nanosheet and the second metal oxide nanosheet being different from each other.

4. The semiconductor device of claim 3,
wherein the first metal oxide nanosheet includes a two-dimensional material having formula of $AB_2O_7$, and
wherein the second metal oxide nanosheet includes a two-dimensional material having formula of $C_2B_3O_{10}$
(Here, element A is lanthanum (La) or europium (Eu), element B is niobium (Nb) or tantalum (Ta), element C is calcium (Ca) or strontium (Sr), and element O is oxygen).

5. The semiconductor device of claim 3, wherein each of the first and second metal oxide nanosheets includes metal oxide selected from the group consisting of titanium oxide, calcium niobium oxide, manganese oxide, niobium oxide, tantalum oxide, and titanium niobium oxide.

6. The semiconductor device of claim 3, wherein each of the first and second metal oxide nanosheets includes a perovskite material.

7. The semiconductor device of claim 6, wherein the perovskite material includes one selected from $Ca_2Nb_3O_{10}$, $Ca_2NaNb_4O_{13}$, $Ca_2Na_2Nb_5O_{16}$, and $Ca_2Na_3Nb_6O_{19}$.

8. The semiconductor device of claim 1, wherein the ferroelectric layer is disposed to contact the semiconductor layer.

9. The semiconductor device of claim 1, wherein the semiconductor layer includes:

a source region in contact with the bit line structure;

a drain region in contact with the source line structure; and a channel region disposed between the source region and the drain region.

10. A semiconductor device comprising:

a substrate;

a bit line structure and a source line structure each extending in a direction perpendicular to a surface of the substrate; and a plurality of unit cell structures electrically connected to the bit line structure and the source line structure, wherein each of the plurality of unit cell structures includes:

a semiconductor layer disposed on a plane parallel to the surface of the substrate over the substrate and in contact with the bit line structure and the source line structure;

a ferroelectric layer disposed on the semiconductor layer and including a ferroelectric superlattice structure; and a gate electrode layer disposed to be spaced apart from the bit line structure and the source line structure on the ferroelectric layer, and wherein the plurality of unit cell structures are disposed to be spaced apart from each other in the direction perpendicular to the surface of the substrate wherein the semiconductor layer, the ferroelectric layer and the gate electrode layer are stacked along the direction perpendicular to the surface of the substrate.

11. The semiconductor device of claim 10, wherein the ferroelectric superlattice structure includes a plurality of two-dimensional nanosheets.

12. The semiconductor device of claim 10, wherein the ferroelectric superlattice structure includes alternately stacked first and second metal oxide nanosheets, the first metal oxide nanosheet and the second metal oxide nanosheet being different from each other.

13. The semiconductor device of claim 12, wherein the first metal oxide nanosheet includes a two-dimensional material having formula of $AB_2O_7$, and wherein the second metal oxide nanosheet includes a two-dimensional material having formula of $C_2B_3O_{10}$ (Here, element A is lanthanum (La) or europium (Eu), element B is niobium (Nb) or tantalum (Ta), element C is calcium (Ca) or strontium (Sr), and element O is oxygen).

14. The semiconductor device of claim 12, wherein each of the first and second metal oxide nanosheets includes metal oxide selected from the group consisting of titanium oxide, calcium niobium oxide, manganese oxide, niobium oxide, tantalum oxide, and titanium niobium oxide.

15. The semiconductor device of claim 12, wherein each of the first and second metal oxide nanosheets includes a perovskite material.

16. The semiconductor device of claim 15, wherein the perovskite material includes one selected from $Ca_2Nb_3O_{10}$, $Ca_2NaNb_4O_{13}$, $Ca_2Na_2Nb_5O_{16}$, and $Ca_2Na_3Nb_6O_{19}$.

17. The semiconductor device of claim 10, wherein the ferroelectric layer is disposed to contact the semiconductor layer.

18. The semiconductor device of claim 10, wherein the semiconductor layer includes:

a source region in contact with the bit line structure;

a drain region in contact with the source line structure; and a channel region disposed between the source region and the drain region.

* * * * *